US012640190B2

(12) United States Patent
Chen et al.

(10) Patent No.: US 12,640,190 B2
(45) Date of Patent: May 26, 2026

(54) MEMORY CIRCUIT WITH LEVEL SHIFTER CIRCUIT AND METHOD OF OPERATING SAME

(71) Applicants: TAIWAN SEMICONDUCTOR MANUFACTURING COMPANY, LTD., Hsinchu (TW); TSMC NANJING COMPANY, LIMITED, Nanjing (CN)

(72) Inventors: Chia-Cheng Chen, Hsinchu (TW); Jun Xie, Hisnchu (TW); Ching-Wei Wu, Hsinchu (TW); Luping Kong, Hsinchu (TW); Chien-Yu Huang, Hsinchu (TW)

(73) Assignees: TAIWAN SEMICONDUCTOR MANUFACTURING COMPANY, LTD., Hsinchu (TW); TSMC NANJING COMPANY, LIMITED, Nanjing (CN)

( * ) Notice: Subject to any disclaimer, the term of this patent is extended or adjusted under 35 U.S.C. 154(b) by 10 days.

(21) Appl. No.: 18/624,551

(22) Filed: Apr. 2, 2024

(65) Prior Publication Data

US 2025/0299725 A1      Sep. 25, 2025

(30) Foreign Application Priority Data

Mar. 19, 2024     (CN) .......................... 202410322190.2

(51) Int. Cl.
*G11C 5/14*          (2006.01)
*G11C 11/4076*       (2006.01)
(Continued)

(52) U.S. Cl.
CPC ...... *G11C 11/4093* (2013.01); *G11C 11/4076* (2013.01); *G11C 11/4085* (2013.01)

(58) Field of Classification Search
CPC ........... G11C 11/4093; G11C 11/4076; G11C 11/4085
See application file for complete search history.

(56) References Cited

U.S. PATENT DOCUMENTS

| | | | |
|---|---|---|---|
| 9,418,716 B1 * | 8/2016 | Pallerla .................... | G11C 5/14 |
| 2008/0144402 A1 * | 6/2008 | Hirabayashi .......... | G11C 11/417 |
| | | | 365/189.11 |

(Continued)

FOREIGN PATENT DOCUMENTS

| | | |
|---|---|---|
| TW | I564895 | 1/2017 |
| TW | I620195 | 4/2018 |

*Primary Examiner* — Mushfique Siddique
(74) *Attorney, Agent, or Firm* — Hauptman Ham, LLP

(57)          ABSTRACT

A memory circuit includes a first and second inverter, and a level shifter circuit. The first inverter is coupled to a first voltage supply, and configured to generate a first input signal in response to a second input signal. The level shifter circuit is coupled to a second voltage supply, and configured generate a first and second signal responsive to a first or second input signal. The second inverter is configured to generate a word line signal in response to the first signal. The level shifter circuit is configured to delay a leading edge of the word line signal in response to the first or second signal. An amount of delay of the leading edge of the word line signal is based on a voltage difference between the first and second supply voltage. The first supply voltage has a first swing. The second supply voltage has a second swing.

20 Claims, 10 Drawing Sheets

(51) Int. Cl.
   *G11C 11/408*      (2006.01)
   *G11C 11/4093*     (2006.01)

(56)             References Cited

U.S. PATENT DOCUMENTS

| | | | |
|---|---|---|---|
| 2011/0194362 A1* | 8/2011 | Lu | G11C 8/10 |
| | | | 365/189.11 |
| 2012/0014158 A1* | 1/2012 | Wu | G11C 17/12 |
| | | | 365/104 |
| 2017/0053689 A1* | 2/2017 | Noguchi | G06F 12/06 |
| 2017/0110164 A1* | 4/2017 | Cheng | G11C 7/10 |
| 2018/0151239 A1 | 5/2018 | Chen et al. | |
| 2018/0309446 A1 | 10/2018 | Luthra | |
| 2021/0005248 A1* | 1/2021 | Verma | G11C 11/417 |

\* cited by examiner

MEMORY CIRCUIT WITH LEVEL SHIFTER CIRCUIT AND METHOD OF OPERATING SAME

PRIORITY

This application claims priority to China Application No. 202410322190.2, filed Mar. 19, 2024, which is incorporated herein by reference in its entirety.

BACKGROUND

The semiconductor integrated circuit (IC) industry has produced a wide variety of digital devices to address issues in a number of different areas. Some of these digital devices, such as memory macros, are configured for the storage of data. As ICs have become smaller and more complex, the resistance of conductive lines within these digital devices is also changed affecting the operating voltages of these digital devices and overall IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
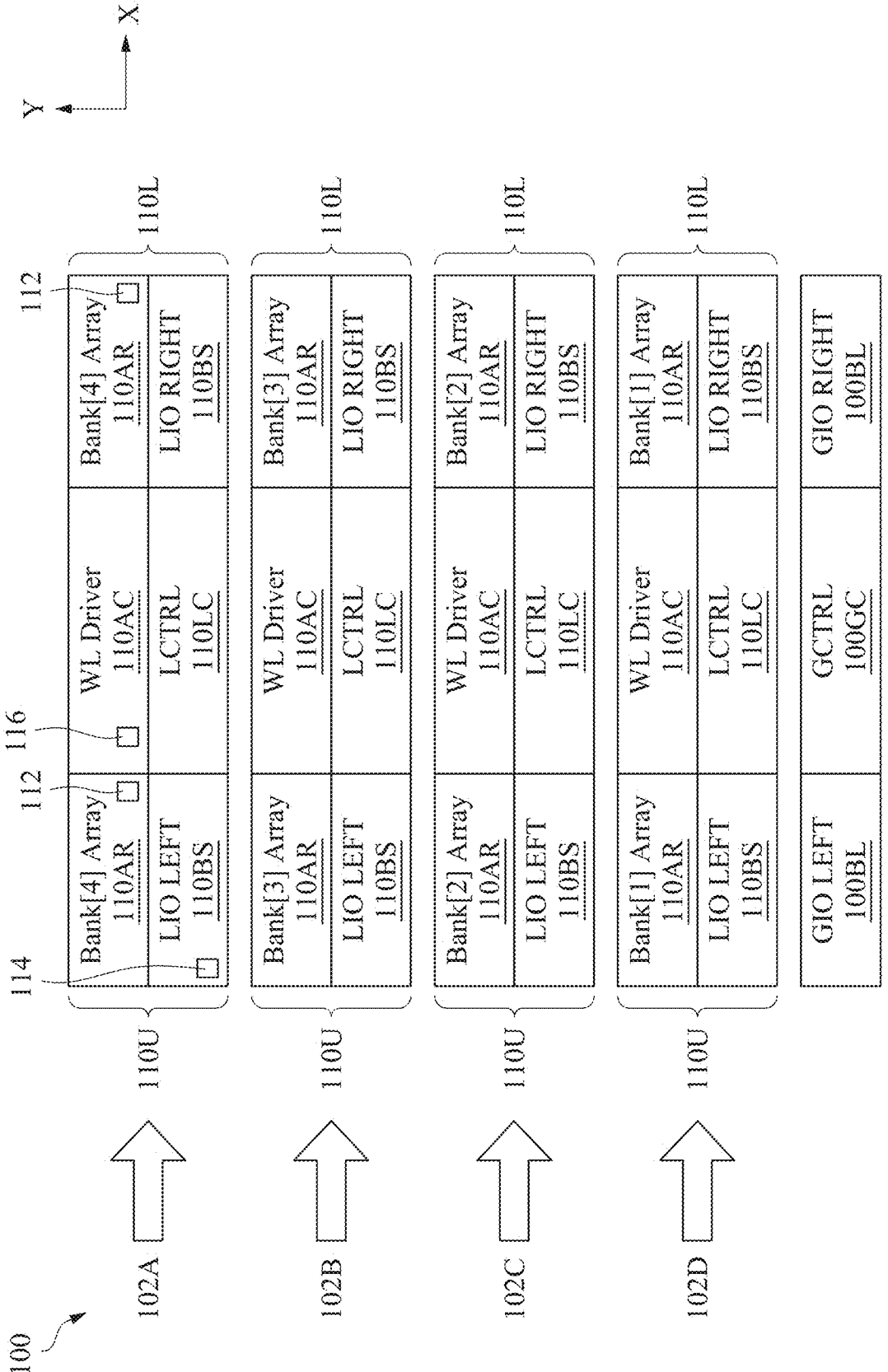
FIG. 1 is a block diagram of a memory circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a memory circuit includes a first inverter coupled to a first voltage supply. In some embodiments, the first inverter is configured to generate a first input signal in response to a second input signal. In some embodiments, the first input signal is inverted from the second input signal.

In some embodiments, the memory circuit further includes a level shifter circuit. In some embodiments, the level shifter circuit is coupled to at least the first inverter or a second voltage supply. In some embodiments, the second voltage supply is different from the first voltage supply.

In some embodiments, the level shifter circuit is configured to receive at least the first input signal or the second input signal. In some embodiments, the level shifter circuit is configured to generate a first signal and a second signal responsive to at least the first input signal or the second input signal.

In some embodiments, the memory circuit further includes a second inverter. In some embodiments, the second inverter is configured to generate a word line signal in response to the first signal.

In some embodiments, the level shifter circuit is configured to delay a leading edge of the word line signal in response to at least the first signal or the second signal. In some embodiments, an amount of delay of the leading edge of the word line signal is based on a voltage difference between the first supply voltage and the second supply voltage. In some embodiments, the first supply voltage has a first swing, and the second supply voltage has a second swing.

In some embodiments, by delaying the leading edge of the word line signal, the level shifter circuit has less early read operations than other approaches thereby resulting in improved performance in comparison with other approaches.

FIG. 1 is a block diagram of a memory circuit 100, in accordance with some embodiments.

FIG. 1 is simplified for the purpose of illustration. In some embodiments, memory circuit 100 includes various elements in addition to those depicted in FIG. 1 or is otherwise arranged to perform the operations discussed below.

Memory circuit 100 is an IC that includes memory partitions 102A-102D, a global control circuit 100GC and global input output (GIO) circuits 100BL.

Each memory partition 102A-102D includes memory banks 110U and 110L adjacent to a word line (WL) driver circuit 110AC and a local control circuit 110LC. Each memory bank 110U and 110L includes a memory cell array 110AR and a local input output (LIO) circuit 110BS.

A memory partition, e.g., a memory partition 102A-102D, is a portion of memory circuit 100 that includes a subset of memory devices (not shown in FIG. 1) and adjacent circuits configured to selectively access the subset of memory devices in program and read operations. In the embodiment depicted in FIG. 1, memory circuit 100 includes a total of four partitions. In some embodiments, memory circuit 100 includes a total number of partitions greater or fewer than four.

GIO circuit 100BL is a circuit configured to control access to one or more electrical paths, e.g., bit lines, to each memory device of the corresponding memory bank 110U or 110L of each memory partition 102A-102D, e.g., by generating one or more bit line signals. In some embodiments, GIO circuit 100BL includes a global bit line driver circuit. In some embodiments, GIO circuit 100BL is coupled to each memory bank 110U and 110L by a corresponding global bit line (not shown).

Global control circuit 100GC is a circuit configured to control some or all of program and read operations on each memory partition 102A-102D, e.g., by generating and/or outputting one or more control and/or enable signals.

In some embodiments, global control circuit 100GC includes one or more analog circuits configured to interface with memory partitions 102A-102D, cause data to be programmed in one or more memory devices, and/or use data received from one or more memory devices in one or more circuit operations. In some embodiments, global control circuit 100GC includes one or more global address decoder or pre-decoder circuits configured to output one or more address signals to the WL driver circuit 110AC of each memory partition 102A-102D.

Each WL driver circuit 110AC is configured to generate word line signals on corresponding word lines WL. In some embodiments, each WL driver circuit 110AC is configured to output word line signals on corresponding word lines WL to the adjacent memory banks 110U and 110L of the corresponding memory partition 102A-102D.

Each WL driver circuit 110AC includes one or more circuits 116. For ease of illustration, circuit 116 is not shown in memory bank 110U and 110L of memory partitions 102B, 102C and 102D. In some embodiments, each circuit 116 includes at least one word line driver circuit or at least at least one tracking word line driver circuit. In some embodiments, at least one word line driver circuit is configured to generate a word line signal WL (shown at least in FIG. 2). In some embodiments, at least one tracking word line driver circuit is configured to generate a tracking word line signal TRKWL (shown at least in FIGS. 7-8). In some embodiments, each circuit 116 in WL driver circuit 110AC is coupled to a corresponding row of memory devices 112 in memory cell array 110AR.

Each local control circuit 110LC is an electronic circuit configured to receive one or more address signals. Each local control circuit 110LC is configured to generate signals corresponding to adjacent subsets of memory devices identified by the one or more address signals. In some embodiments, the adjacent subsets of memory devices correspond to columns of memory devices. In some embodiments, each local control circuit 110LC is configured to generate each signal as a complementary pair of signals. In some embodiments, each local control circuit 110LC is configured to output the signals to corresponding word line driver circuits within the adjacent WL driver circuit 110AC of the corresponding memory partition 102A-102D. In some embodiments, the local control circuit 110LC includes a bank decoder circuit.

Each LIO circuit 110BS is configured to selectively access one or more bit lines (shown in FIG. 2) coupled to adjacent subsets of memory devices of the corresponding memory cell array 110AR responsive to GIO circuit 100BL, e.g., based on one or more BL control signals. In some embodiments, the adjacent subsets of memory devices correspond to rows of memory devices. In some embodiments, the LIO circuit 110BS includes a bit line selection circuit.

Each LIO circuit 110BS includes one or more circuits 114. For ease of illustration, circuit 114 is not shown in memory bank 110U and 110L of memory partitions 102B, 102C and 102D. In some embodiments, each circuit 114 includes at least a sense amplifier circuit or a write-in latch circuit. During a write operation, the write-in latch circuit is configured to write data into at least one memory cell 112 in a corresponding column of memory cells in the corresponding memory cell array 110AR, in accordance with some embodiments. During a read operation, the sense amplifier circuit is configured to read data from at least one memory cell 112 in a corresponding column of memory cells in the corresponding memory cell array 110AR, in accordance with some embodiments. In some embodiments, each circuit 114 in LIO circuit 110BS is coupled to a corresponding column of memory devices 112 in memory cell array 110AR.

Each memory bank 110U and 110L includes the corresponding memory cell array 110AR including memory cells or memory devices 112 configured to be accessed in program and read operations by the adjacent LIO circuit 110BS and the adjacent WL driver circuit 110AC.

Each memory cell array 110AR includes an array of memory devices 112 having N rows and M columns, where M and N are positive integers. The rows of cells in memory cell array 102 are arranged in a first direction X. The columns of cells in memory cell array 102 are arranged in a second direction Y. The second direction Y is different from the first direction X. In some embodiments, the second direction Y is perpendicular to the first direction X. In some embodiments, each memory cell array 110AR is divided into an upper region and a lower region (not shown). In some embodiments, each column of memory devices 112 in memory cell array 110AR is coupled to a corresponding circuit 114 in LIO circuit 110BS.

Memory device 112 is shown in memory bank 110U and 110L of memory partition 102A. For ease of illustration, memory device 112 is not shown in memory bank 110U and 110L of memory partitions 102B, 102C and 102D.

Memory device 112 is an electrical, electromechanical, electromagnetic, or other device configured to store bit data represented by logical states. At least one logical state of memory device 112 is capable of being programmed in a write operation and detected in a read operation. In some embodiments, a logical state corresponds to a voltage level of an electrical charge stored in a given memory device 112. In some embodiments, a logical state corresponds to a physical property, e.g., a voltage, a current, a resistance or a magnetic orientation, of a component of a given memory device 112.

In some embodiments, memory device 112 includes one or more single port (SP) static random access memory (SRAM) cells. In some embodiments, memory device 112 includes one or more dual port (DP) SRAM cells. In some embodiments, memory device 112 includes one or more multi-port SRAM cells. Different types of memory cells in memory device 112 are within the contemplated scope of the present disclosure. In some embodiments, memory device 112 includes one or more dynamic random access memory (DRAM) cells. In some embodiments, memory device 112 includes one or more one-time programmable (OTP) memory devices such as electronic fuse (eFuse) or anti-fuse devices, flash memory devices, random-access memory (RAM) devices, resistive RAM devices, ferroelectric RAM devices, magneto-resistive RAM devices, erasable programmable read only memory (EPROM) devices, electrically erasable programmable read only memory (EEPROM) devices, or the like. In some embodiments, memory device 112 is an OTP memory device including one or more OTP memory cells.

Other configurations of memory circuit 100 are within the scope of the present disclosure.

Figure 2:
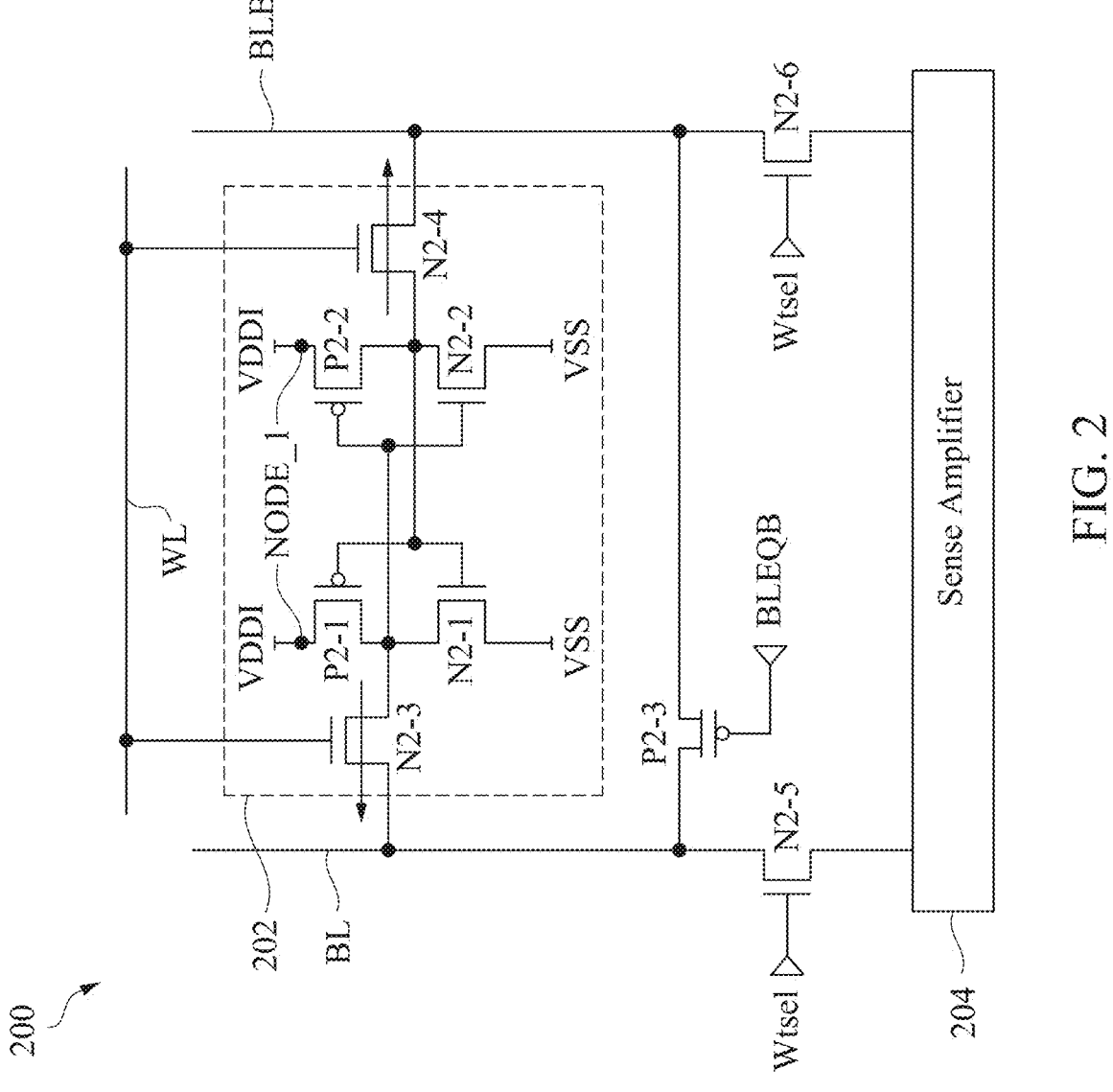
FIG. 2 is a circuit diagram of a memory circuit, in accordance with some embodiments.

FIG. 2 is a circuit diagram of a memory circuit 200 usable in FIG. 1, in accordance with some embodiments.

Memory circuit 200 is an embodiment of one or more memory cells MCB in at least one of memory cell array 110AR of FIG. 1 or memory device 112 of FIG. 1.

Memory circuit 200 is an embodiment of a portion of at least one of memory partition 102A, 102B, 102C or 102D of FIG. 1, and similar detailed description is therefore omitted. For example, memory circuit 200 is an embodiment of memory cell array 110AR of FIG. 1 and LIO circuit 110BS of FIG. 1, and similar detailed description is therefore omitted.

Memory circuit 200 comprises a memory cell 202, a sense amplifier 204, a p-type metal-oxide semiconductor (PMOS) transistor P2-3, and two n-type metal-oxide semiconductor (NMOS) transistors N2-5 and N2-6.

Memory cell 202 is usable as one or more memory cells MCB in at least one of memory cell array 110AR of FIG. 1 or memory device 112 of FIG. 1, and similar detailed description is therefore omitted. In some embodiments, sense amplifier 204, PMOS transistor P2-3, and NMOS transistors N2-5 and N2-6 are usable as LIO circuit 110BS of FIG. 1, and similar detailed description is therefore omitted. In some embodiments, sense amplifier 204 is usable as circuit 114 of FIG. 1, and similar detailed description is therefore omitted.

In some embodiments, sense amplifier 204, PMOS transistor P2-3, and NMOS transistors N2-5 and N2-6 are usable as GIO circuit 100BL of FIG. 1, and similar detailed description is therefore omitted.

Memory cell 202 is a six transistor (6T) single port (SP) SRAM memory cell used for illustration. In some embodiments, memory cell 202 employs a number of transistors other than six. Other types of memory are within the scope of various embodiments.

Memory cell 202 comprises two PMOS transistors P2-1 and P2-2, and four NMOS transistors N2-1, N2-2, N2-3, and N2-4. Transistors P2-1, P2-2, N2-1, and N2-2 form a cross latch or a pair of cross-coupled inverters. For example, PMOS transistor P2-1 and NMOS transistor N2-1 form a first inverter while PMOS transistor P2-2 and NMOS transistor N2-2 form a second inverter.

A source terminal of each of PMOS transistors P2-1 and P2-2 are configured as a voltage supply node NODE_1. Each voltage supply node NODE_1 is coupled to a first voltage supply VDDI. A drain terminal of PMOS transistor P2-1 is coupled with a drain terminal of NMOS transistor N2-1, a gate terminal of PMOS transistor P2-2, a gate terminal of NMOS transistor N2-2, and a source terminal of NMOS transistor N2-3 and is configured as a storage node ND.

A drain terminal of PMOS transistor P2-2 is coupled with a drain terminal of NMOS transistor N2-2, a gate terminal of PMOS transistor P2-1, a gate terminal of NMOS transistor N2-1, and a source terminal of NMOS transistor N2-4 and is configured as a storage node NDB. A source terminal of each of NMOS transistors N2-1 and N2-2 is configured as a supply reference voltage node (not labelled) having a supply reference voltage VSS. The source terminal of each of NMOS transistors N2-1 and N2-2 is also coupled to reference voltage supply VSS.

A word line WL is coupled with a gate terminal of each of NMOS transistors N2-3 and N2-4. Word line WL is also called a write control line because NMOS transistors N2-3 and N2-4 are configured to be controlled by a word line signal WL' on word line WL in order to transfer data between bit lines BL, BLB and corresponding nodes ND, NDB.

A drain terminal of NMOS transistor N2-3 is coupled to a bit line BL. A drain terminal of NMOS transistor N2-4 is coupled to a bit line BLB. Bit lines BL and BLB are configured as both data input and output for memory cell 202. In some embodiments, in a write operation, applying a logical value to a bit line BL and the opposite logical value to the other bit line BLB enables writing the logical values on the bit lines to memory cell 202. Each of bit lines BL and BLB is called a data line because the data carried on bit lines BL and BLB are written to and read from corresponding nodes ND and NDB.

Other configurations of memory cell 202 are within the scope of the present disclosure.

Sense amplifier 204 is coupled to memory cell 202 by bit lines BL and BLB, and NMOS transistors N2-5 and N2-6. Sense amplifier 204 is configured to sense or read data stored in memory cell 202 by a bit line split between a bit lines BL and BLB. For example, in some embodiments, sense amplifier 204 is configured to sense or read data stored in memory cell 202 by a bit line split between bit lines BL and BLB.

Other configurations of sense amplifier 204 are within the scope of the present disclosure.

PMOS transistor P2-3 is configured to equalize the voltage of bit lines BL and BLB to an equalized bit line voltage responsive to a signal BLEQB. In some embodiments, PMOS transistor P2-3 is referred to as an "equalization circuit."

A gate of PMOS transistor P2-3 is configured to receive the signal BLEQB. In some embodiments, signal BLEQB is an equalization signal.

A source/drain of PMOS transistor P2-3 is coupled with bit line BL, a source/drain of NMOS transistor N2-5 and the drain of NMOS transistor N2-3.

A drain/source of PMOS transistor P2-3 is coupled with bit line BLB, a source/drain of NMOS transistor N2-6 and the drain of NMOS transistor N2-4.

Other configurations, quantities or types of transistors in PMOS transistor P2-3 are within the scope of the present disclosure.

In response to a selection signal Wtsel, NMOS transistor N2-5 is configured to couple/decouple the sense amplifier 204 and memory cell 202/bit line BL to/from each other. A gate of NMOS transistor N2-5 is configured to receive the selection signal Wtsel.

The source/drain of NMOS transistor N2-5 is coupled with the source/drain of PMOS transistor P2-3, the bit line BL and the drain of NMOS transistor N2-3.

A drain/source of NMOS transistor N2-5 is sense amplifier 204.

In response to the selection signal Wtsel, NMOS transistor N2-6 is configured to couple/decouple the sense amplifier 204 and memory cell 202/bit line BLB to/from each other.

A gate of NMOS transistor N2-6 is configured to receive the selection signal Wtsel.

The source/drain of NMOS transistor N2-6 is coupled with the drain/source of PMOS transistor P2-3, the bit line BLB and the drain of NMOS transistor N2-4.

A drain/source of NMOS transistor N2-5 is sense amplifier 204.

Other configurations, quantities or types of transistors in NMOS transistor N2-5 or N2-6 are within the scope of the present disclosure.

In some embodiments, a leading edge of the word line signal WL' on the word line WL is aligned with a leading edge of the selection line signal Wtsel. In some embodiments, the leading edge of the word line signal includes a rising edge or a falling edge.

In some embodiments, a rising edge of the word line signal WL' on the word line WL is aligned with a rising edge of the selection line signal Wtsel. In some embodiments, a falling edge of the word line signal on the word line WL is aligned with a falling edge of the selection line signal Wtsel.

Other configurations of memory circuit 200 are within the scope of the present disclosure.

Figure 3:
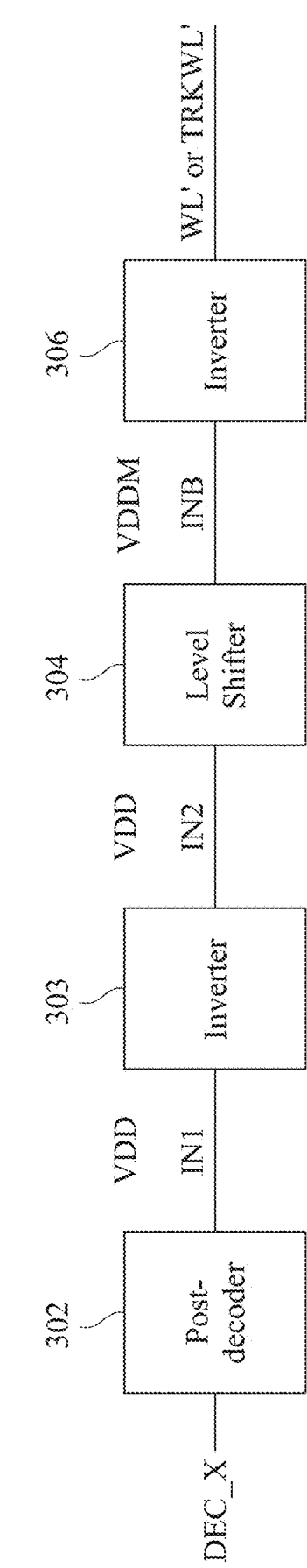
FIG. 3 is a block diagram of a memory circuit usable in FIG. 1, in accordance with some embodiments.

FIG. 3 is a block diagram of a memory circuit 300 usable in FIG. 1, in accordance with some embodiments.

Memory circuit 300 is an embodiment of a portion of at least one of memory partition 102A, 102B, 102C or 102D of FIG. 1, and similar detailed description is therefore omitted. For example, memory circuit 300 is an embodiment of one row of the WL driver circuit 110AC of FIG. 1, and similar detailed description is therefore omitted.

Memory circuit 300 is configured to receive a decoder signal DEC_X. Memory circuit 300 is configured to generate a word line signal WL' or a tracking word line signal TRKWL' in response to the decoder signal DEC_X. In some embodiments, memory circuit 300 is a word line driver circuit (e.g., FIG. 4 or 6) configured to generate the word line signal WL' in response to the decoder signal DEC_X.

In some embodiments, memory circuit 300 is a tracking word line driver circuit (e.g., FIG. 7) configured to generate the tracking word line signal TRKWL' in response to the decoder signal DEC_X. In some embodiments, a tracking word line driver circuit is a word line driver circuit configured to compensate for at least one of word line loading, signal line loading, memory cell loading or signal swings from faster process corners that can affect a pulse width of the word line signal and affecting performance of the memory circuit 300.

Post-decoder circuit 302 is coupled to inverter 303. Post-decoder circuit 302 is configured to receive the decoder signal DEC_X. Post-decoder circuit 302 is configured to generate an input signal IN1 in response to the decoder signal DEC_X. In some embodiments, the decoder signal DEC_X is generated by local control circuit 110LC of FIG. 1, and similar detailed description is therefore omitted.

In some embodiments, the post-decoder circuit 302 includes one or more word line decoder circuits coupled to a corresponding word line or word line bar and a corresponding row of memory cells in memory cell array 110AR. In some embodiments, the post-decoder circuit 302 is configured to select a corresponding row of memory cells in the memory cell array 110AR by a corresponding word line signal WL'. In some embodiments, each of the one or more word line decoder circuits includes a corresponding NAND logic gate (not shown) or NOR logic gate (not shown). Other type of word line decoder circuits in the post-decoder circuit 302 are within the scope of the present disclosure.

An input terminal of the post-decoder circuit 302 is configured to receive the decoder signal DEC_X. The input terminal of the post-decoder circuit 302 is coupled to a source (not shown) of the decoder signal DEC_X.

An output terminal of the post-decoder circuit 302 is configured to output the input signal IN1. The output terminal of the post-decoder circuit 302 is coupled to an input terminal of inverter 303.

Other configurations of post-decoder circuit 302 are within the scope of the present disclosure.

Inverter 303 is configured to generate an input signal IN2 in response to the input signal IN1.

The input terminal of inverter 303 is configured to receive the input signal IN1. An output terminal of inverter 303 is configured to output the input signal IN2. In some embodiments, the input signal IN2 is an inverted version of the input signal IN1. In some embodiments, inverter 303 is part of level shifter 304. In some embodiments, inverter 303 is not part of level shifter 304.

Other configurations of inverter 303 are within the scope of the present disclosure.

Level shifter 304 is a level shifter circuit configured to shift signals from a first voltage domain that uses a supply voltage VDD to a second voltage domain that uses a supply voltage VDDM. In some embodiments, the supply voltage VDD is less than the supply voltage VDDM. In some embodiments, the supply voltage VDD is greater than the supply voltage VDDM.

Level shifter 304 is configured to receive input signal IN2 on an input terminal (not labelled), and to output an inverted input signal INB on an output terminal (not labeled). Input signal IN2 corresponds to an input signal of level shifter 304, and inverted input signal INB corresponds to an output signal of level shifter 304. Level shifter 304 is configured to generate the inverted input signal INB based on the input signal IN2.

Inverted input signal INB corresponds to an inverted and level shifted version of input signal IN2. Decoder signal DEC_X is in the first voltage domain. Input signals IN1 and IN2 are in the first voltage domain. Inverted input signal INB is in the second voltage domain.

An input terminal of level shifter 304 is coupled to an output terminal of post-decoder circuit 302. An output terminal of level shifter 304 is coupled to an input terminal of an inverter 306.

Other configurations of level shifter 304 are within the scope of the present disclosure.

Inverter 306 is configured to generate the word line signal WL' or a tracking word line signal TRKWL' in response to the inverted input signal INB.

The input terminal of inverter 306 is configured to receive the inverted input signal INB. An output terminal of inverter 306 is configured to output the word line signal WL' or the tracking word line signal TRKWL'. In some embodiments, the word line signal WL' or the tracking word line signal TRKWL' is an inverted version of the inverted input signal INB.

Other configurations of inverter 306 are within the scope of the present disclosure.

Other configurations of memory circuit 300 are within the scope of the present disclosure.

Figure 4:
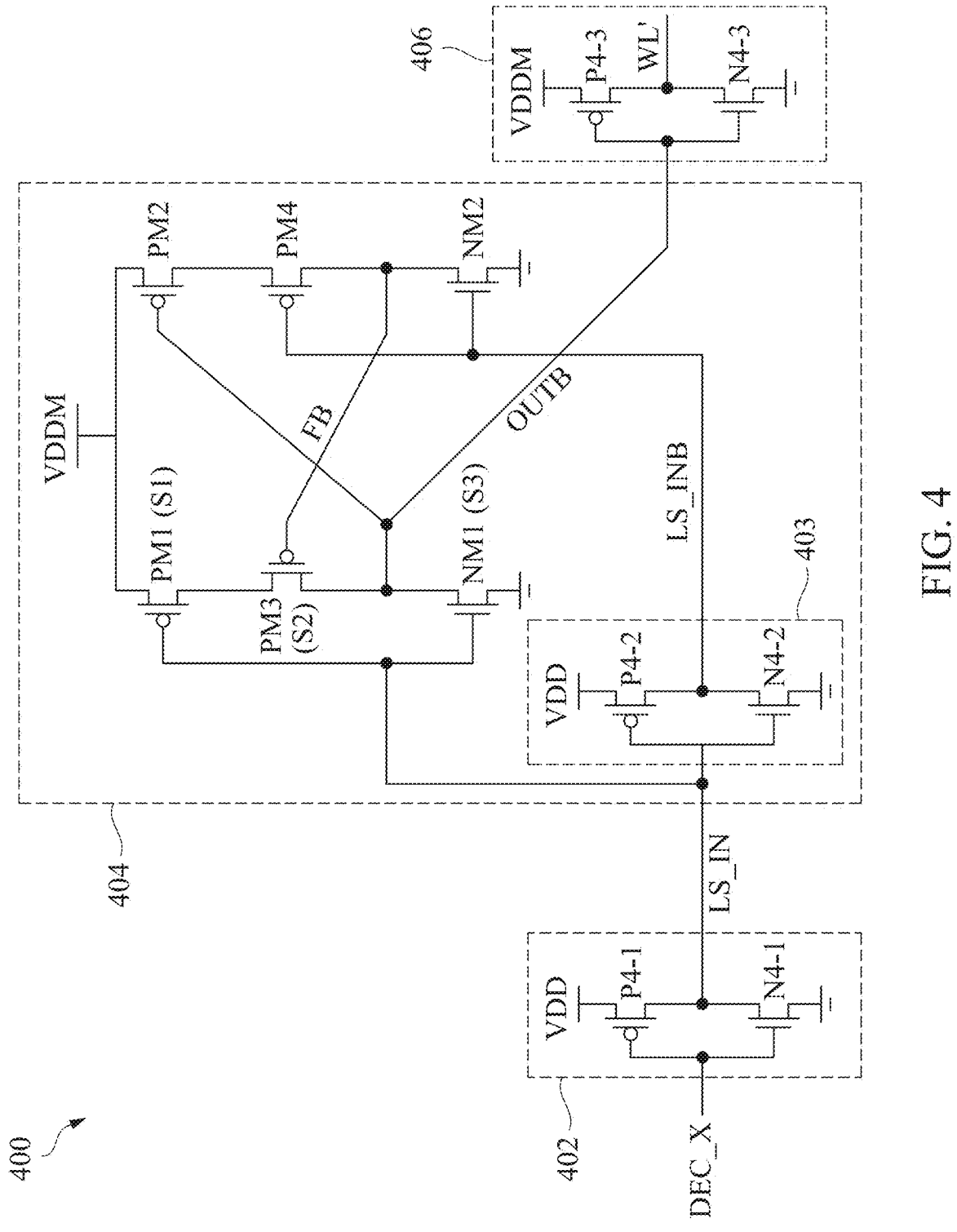
FIG. 4 is a circuit diagram of a memory circuit, in accordance with some embodiments.

FIG. 4 is a circuit diagram of a memory circuit 400, in accordance with some embodiments.

Memory circuit 400 is an embodiment of memory circuit 300, and similar detailed description is therefore omitted. Memory circuit 400 is an embodiment of a portion of at least one of memory partition 102A, 102B, 102C or 102D of FIG. 1, and similar detailed description is therefore omitted. For example, memory circuit 400 is an embodiment of one row of the WL driver circuit 110AC of FIG. 1, and similar detailed description is therefore omitted.

In some embodiments, memory circuit 400 is a dual-rail circuit implementation using signals (e.g., word line WL' and signal LS_IN) of two different voltage domains.

Figure 7:
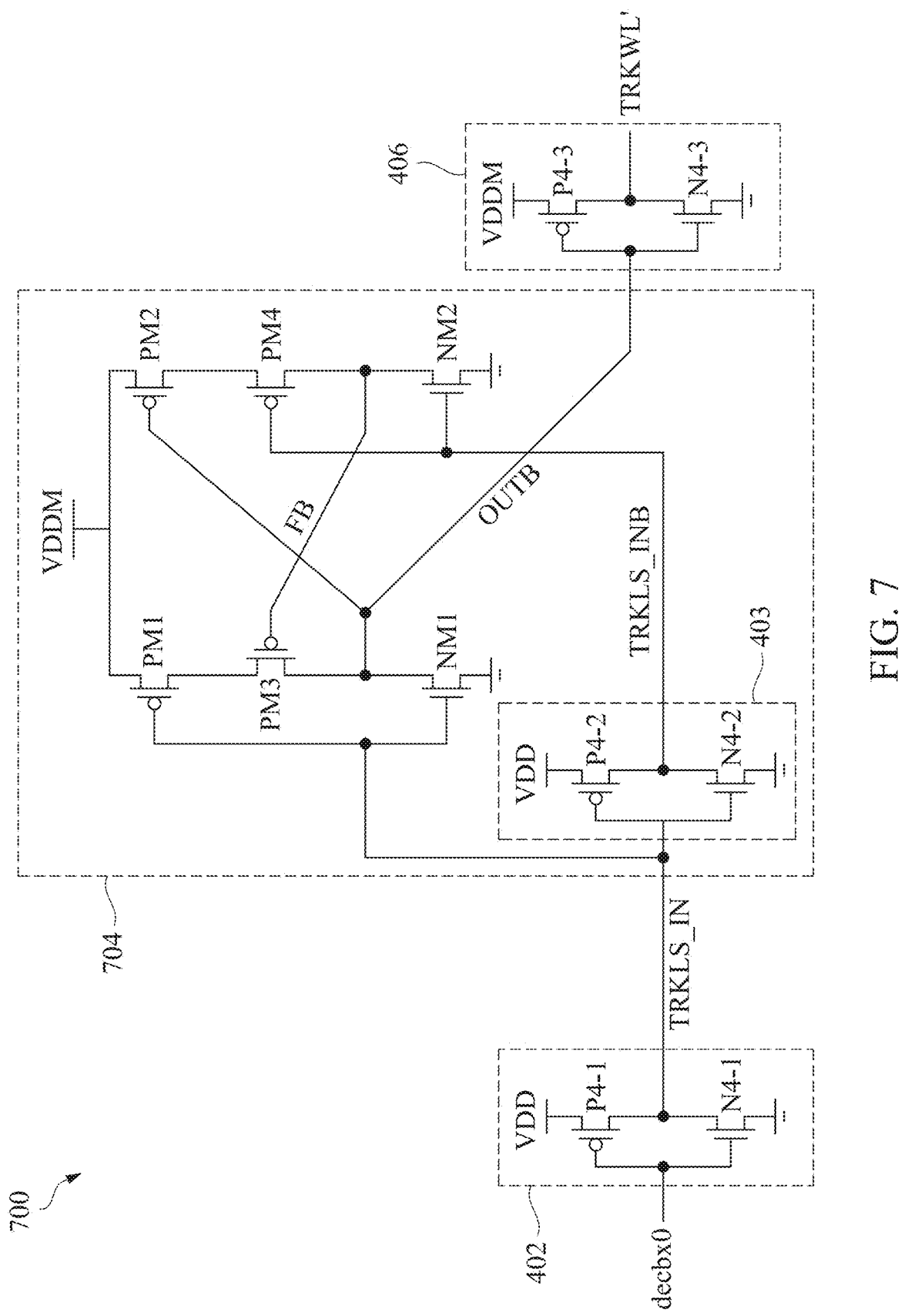
FIG. 7 is a circuit diagram of a memory circuit, in accordance with some embodiments.

Memory circuit 400 includes an inverter 402, an inverter 403, a level shifter 404, and an inverter 406. As shown in FIGS. 4 and 7, inverter 403 is part of level shifter 404. In some embodiments, inverter 403 is not part of level shifter 404.

Inverter 402 is an embodiment of post-decoder circuit 302, inverter 403 is an embodiment of inverter 303, level shifter 404 is an embodiment of level shifter 304, and inverter 406 is an embodiment of inverter 306, and similar detailed description is therefore omitted.

Signal LS_IN is an embodiment of input signal IN1, signal LS_INB is an embodiment of input signal IN2, and signal OUTB is an embodiment of inverted input signal INB, and similar detailed description is therefore omitted.

Signal LS_IN and signal LS_INB are in the first voltage domain. Signal FB, signal OUTB, and word line signal WL' are in the second voltage domain.

Inverter 402 includes a PMOS transistor P4-1 and an NMOS transistor N4-1.

PMOS transistor P4-1 and NMOS transistor N4-1 are configured as inverter 402 and are configured to generate signal LS_IN in response to the decoder signal DEC_X. In some embodiments, signal LS_IN is inverted from the decoder signal DEC_X.

A source of PMOS transistor P4-1 is coupled to a first voltage supply having a supply voltage VDD. In some embodiments, the supply voltage VDD has a voltage swing ranging from VDD to VSS.

A source of NMOS transistor N4-1 is coupled to a reference voltage supply VSS.

Each of a gate of PMOS transistor P4-1 and a gate of NMOS transistor N4-1 are coupled together and are configured to receive decoder signal DEC_X.

Each of a drain of PMOS transistor P4-1 and a drain of NMOS transistor N4-1 are coupled together, and are configured to generate the signal LS_IN.

Each of the drain of PMOS transistor P4-1, the drain of NMOS transistor N4-1, a gate of PMOS transistor P4-2, a gate of NMOS transistor N4-2, a gate of PMOS transistor PM1 and a gate of NMOS transistor NM1 are coupled together.

Other configurations of inverter 402 are within the scope of the present disclosure.

Inverter 403 includes a PMOS transistor P4-2 and an NMOS transistor N4-2.

PMOS transistor P4-2 and NMOS transistor N4-2 are configured as inverter 403 and are configured to generate signal LS_INB in response to the signal LS_IN. In some embodiments, signal LS_INB is inverted from the signal LS_IN.

A source of PMOS transistor P4-2 is coupled to the first voltage supply having the supply voltage VDD.

A source of NMOS transistor N4-2 is coupled to the reference voltage supply VSS.

Each of a gate of PMOS transistor P4-2 and a gate of NMOS transistor N4-2 are coupled together and are configured to receive signal LS_IN.

Each of a drain of PMOS transistor P4-2 and a drain of NMOS transistor N4-2 are coupled together, and are configured to generate signal LS_INB.

Each of the drain of PMOS transistor P4-2, the drain of NMOS transistor N4-2, a gate of PMOS transistor PM4 and a gate of NMOS transistor NM2 are coupled together.

Other configurations of inverter 403 are within the scope of the present disclosure.

Level shifter 404 includes a PMOS transistor PM1, a PMOS transistor PM2, a PMOS transistor PM3, a PMOS transistor PM4, an NMOS transistor NM1 and an NMOS transistor NM2.

A source of PMOS transistor PM1 is coupled to the second voltage supply having the supply voltage VDDM.

Each of a gate of PMOS transistor PM1 and a gate of NMOS transistor NM1 are coupled together, and configured to receive signal LS_IN.

Each of a drain of PMOS transistor PM1 and a source of PMOS transistor PM3 are coupled together.

Each of a drain of PMOS transistor PM3, a drain of transistor NM1, a gate of PMOS transistor P4-3, a gate of NMOS transistor N4-3, and a gate of PMOS transistor PM2 are coupled together.

Each of the drain of PMOS transistor PM3 and the drain of transistor NM1 are configured to generate signal OUTB.

A gate of PMOS transistor PM3 is configured to receive signal FB.

Each of the gate of PMOS transistor PM3, a drain of PMOS transistor PM4 and a drain of transistor NM2 are coupled together.

A source of transistor NM1 is coupled to the reference voltage supply VSS.

A source of PMOS transistor PM2 is coupled to the second voltage supply having the supply voltage VDDM. In some embodiments, the source of PMOS transistor PM2 is coupled to the source of PMOS transistor PM1.

The gate of PMOS transistor PM2 is configured to receive signal OUTB.

Each of a drain of PMOS transistor PM2 and a source of PMOS transistor PM4 are coupled together.

Each of the drain of PMOS transistor PM4 and the drain of transistor NM2 are configured to generate signal FB.

Each of the gate of PMOS transistor PM4 and the gate of NMOS transistor NM2 are coupled together, and configured to receive signal LS_INB.

A source of transistor NM2 is coupled to the reference voltage supply VSS. In some embodiments, the source of NMOS transistor NM2 is coupled to the source of NMOS transistor NM1.

In some embodiments, the level shifter 404 is configured to delay a transition of signal OUTB from logically high to logically low by a delay DEL1 due to contention (discussed further in at least FIG. 5) between NMOS transistor NM1 and at least one of PMOS transistor PM1 or PMOS transistor PM3. In some embodiments, the level shifter 404 is configured to delay a transition of signal FB from logically low to logically high by the delay DEL1 due to contention (discussed further in at least FIG. 5) between NMOS transistor NM1 and at least one of PMOS transistor PM1 or PMOS transistor PM3. In some embodiments, the delay DEL1 can be adjusted by memory circuit 400.

In some embodiments, the amount of delay DEL1 is positively correlated to a difference between the second voltage supply VDDM and the first voltage supply VDD because of at least contention between NMOS transistor NM1 and at least one of PMOS transistor PM1 or PMOS transistor PM3. In some embodiments, as the difference between the second voltage supply VDDM and the first voltage supply VDD is increased, then at least one of the PMOS transistors PM1 or PM3 becomes stronger than the NMOS transistor NM1, thereby increasing the amount of delay DEL1. In some embodiments, as the difference between the second voltage supply VDDM and the first voltage supply VDD is decreased, then the amount of delay DEL1 is also decreased.

In some embodiments, by delaying the transition of signal OUTB from logically high to logically low or by delaying the transition of signal FB from logically low to logically high, thereby results in a delay DEL2 (shown in FIG. 9) of a transition of the word line signal WL' from logically low to logically high. Stated differently, by delaying the transition of signal OUTB from logically high to logically low or by delaying the transition of signal FB from logically low to logically high, thereby results in a delay DEL2 (shown in FIG. 9) of the rising/falling edge of the word line signal WL'. In some embodiments, by delaying the rising/falling edge of the word line signal WL', the rising/falling edge of the word line signal WL' can be synchronized with the rising/falling edge of selection signal Wtsel. In some embodiments, synchronizing the rising/falling edge of the word line signal WL' and the rising/falling edge of selection signal Wtsel results in less early read operations than other approaches thereby resulting in improved performance than other approaches. In some embodiments, an early read operation occurs when the rising/falling edge of the word line signal WL' occurs before the rising/falling edge of the selection signal Wtsel resulting in a misread of the memory cell as the voltages of the bit line/bit line bar may not be sufficiently developed for a read or write operation.

In some embodiments, synchronizing the rising/falling edge of the word line signal WL' and the rising/falling edge of selection signal Wtsel stresses the static noise margin (SNM) of memory circuit 400 the same or better than other approaches.

In some embodiments, PMOS transistor PM1 has a size S1, PMOS transistor PM3 has a size S2, and NMOS transistor NM1 has a size S3. In some embodiments, at least one of size S1, S2 or S3 is the same as at least another of size S1, S2, or S3. In some embodiments, at least one of size S1, S2 or S3 is different from at least another of size S1, S2, or S3.

In some embodiments, a size of a transistor includes at least a channel width of the transistor. In some embodiments, at least one of size S1, S2, S3 or S4 includes a corresponding channel width of the corresponding transistor.

In some embodiments, at least one of PMOS transistor PM1, PM2, PM3, PM4 or PM5 is a nanosheet transistor. In some embodiments, at least one of NM1 or NM2 is a nanosheet transistor. In some embodiments, a size of a transistor includes at least a number of sheets in the transistor. In some embodiments, at least one of size S1, S2, S3 or S4 includes a corresponding number of sheets of the corresponding transistor.

In some embodiments, at least one of PMOS transistor PM1, PM2, PM3, PM4 or PM5 is a nanowire transistor. In some embodiments, at least one of NMOS transistor NM1 or NM2 is a nanowire transistor. In some embodiments, a size of a transistor includes at least a number of wires in the transistor. In some embodiments, at least one of size S1, S2, S3 or S4 includes a corresponding number of wires of the corresponding transistor.

In some embodiments, at least one of PMOS transistor PM1, PM2, PM3, PM4 or PM5 is a Fin field-effect transistor (FinFET). In some embodiments, at least one of NMOS transistor NM1 or NM2 is a FinFET. In some embodiments, each FinFET has one or more fins or fingers. In some embodiments, a fin is referred to as a finger.

In some embodiments, a size of a transistor includes at least a number of fins of the transistor. In some embodiments, at least one of size S1, S2, S3 or S4 includes a corresponding number of fins of the corresponding transistor.

Other transistor types and transistor size types are within the scope of the present disclosure.

In some embodiments, at least one of size S1 or S2 is different from size S3. In some embodiments, as the size S1 of PMOS transistor PM1 or the size S2 of PMOS transistor PM3 is increased compared to size S3, then the amount of delay DEL1 is increased thereby causing the delay DEL2 (shown in FIG. 9) to be increased. In some embodiments, as the size S1 of PMOS transistor PM1 or the size S2 of PMOS transistor PM3 is decreased compared to size S3, then the amount of delay DEL1 is decreased thereby causing the delay DEL2 (shown in FIG. 9) to be decreased.

In some embodiments, as the size S3 of NMOS transistor NM1 is increased compared to size S1 or S2, then the amount of delay DEL1 is decreased thereby causing the delay DEL2 (shown in FIG. 9) to be decreased. In some embodiments, as the size S3 of NMOS transistor NM1 is decreased compared to size S1 or S2, then the amount of delay DEL1 is increased thereby causing the delay DEL2 (shown in FIG. 9) to be increased.

Other configurations of level shifter 404 are within scope of the present disclosure.

Inverter 406 includes a PMOS transistor P4-3 and an NMOS transistor N4-3.

PMOS transistor P4-3 and NMOS transistor N4-3 are configured as inverter 406 and are configured to generate word line signal WL' in response to the signal OUTB. In some embodiments, word line signal WL' is inverted from the signal OUTB.

A source of PMOS transistor P4-3 is coupled to the second voltage supply having the supply voltage VDDM.

A source of NMOS transistor N4-3 is coupled to the reference voltage supply VSS.

Each of a gate of PMOS transistor P4-3, a gate of NMOS transistor N4-3 and a gate of PMOS transistor PM2 are coupled together, and are configured to receive signal OUTB.

Each of a drain of PMOS transistor P4-3 and a drain of NMOS transistor N4-3 are coupled together, and are configured to generate word line signal WL'.

Other configurations of inverter 406 are within the scope of the present disclosure.

In some embodiments, memory circuit 400 is configured such that NMOS transistor NM1 is in contention with at least one of PMOS transistor PM1 or PMOS transistor PM3 for the falling edge of signal OUTB or the rising edge of signal FB.

In some embodiments, memory circuit 400 is configured such that NMOS transistor NM2 is not in contention with at least one of PMOS transistor PM4 or PMOS transistor PM2 for the rising edge of signal OUTB or the falling edge of signal FB.

In some embodiments, level shifter 406 or 606 is referred to as an "asymmetric level shifter" since the contention between the NMOS transistor NM1 and least one of PMOS transistor PM1 or PMOS transistor PM3 for the falling edge of signal OUTB or the rising edge of signal FB.

In some embodiments, by memory circuit 400 being configured to adjust the delay DEL1, memory circuit 400 has a more flexible memory design than other approaches.

Other configurations, other types of circuit elements or numbers of circuit elements in memory circuit 400 are within the scope of the present disclosure.

Figure 5:
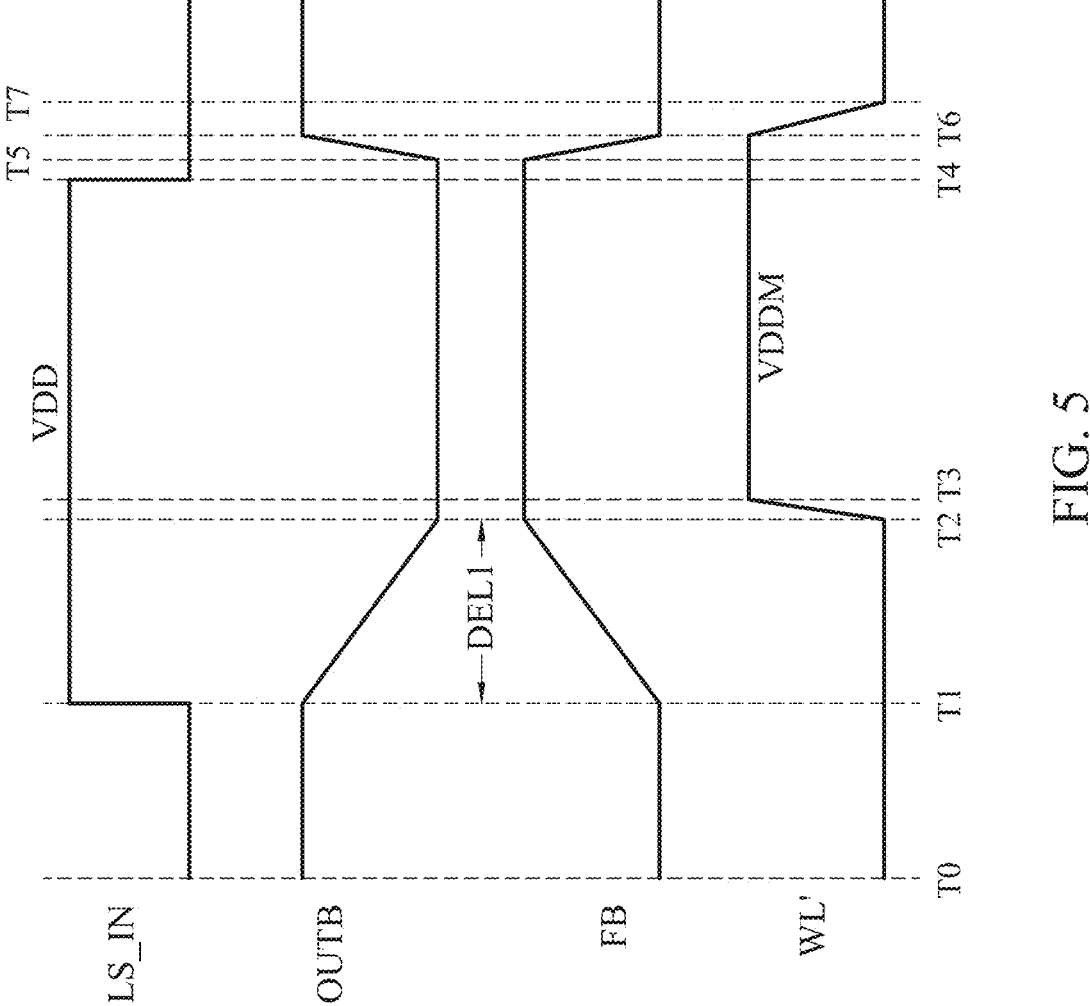
FIG. 5 is a timing diagram of waveforms of a memory circuit, such as the memory circuit in FIG. 4, in accordance with some embodiments.

FIG. 5 is a timing diagram 500 of waveforms of a memory circuit, such as memory circuit 400 in FIG. 4, in accordance with some embodiments.

In some embodiments, one or more read operations or write operations are applied to memory cell 202 of FIG. 2 or at least one memory cell in a single column of memory cell array 110AR of FIG. 1, and timing diagram 500 corresponds to waveforms during the one or more read operations or write operations of memory cell 202 of FIG. 2 or at least one memory cell in a single column of memory cell array 110AR of FIG. 1.

In some embodiments, one or more read operations or write operations of the memory banks in at least memory circuit 100 of FIG. 1 are applied to at least one of memory partition 102A, 102B, 102C or 102D, and timing diagram 500 corresponds to waveforms during the read operations or write operations of at least one of memory partition 102A, 102B, 102C or 102D.

Timing diagram 500 includes waveforms of the signal LS_IN, the signal OUTB, the signal FB or the word line signal WL'.

At time T0, the signal LS_IN is logically low, the signal OUTB is logically high, the signal FB is logically low, and the word line signal WL' is logically low.

At time T1, the signal LS_IN transitions from logically low to logically high. In some embodiments, in response to the signal LS_IN transitioning from logically low to logically high, thereby causes the signal LS_INB (not shown in FIG. 5) to transition from logically high to logically low.

At time T1, the signal OUTB transitions from logically high to logically low, and the signal FB transitions from logically low to logically high.

In some embodiments, at time T1, the signal OUTB transitions from logically high to logically low in response to at least the signal LS_IN transitioning from logically low to logically high or the signal FB transitioning from logically low to logically high. For example, in response to the signal LS_IN transitioning from logically low to logically high thereby causes NMOS transistor NM1 to turn on, and PMOS transistor PM1 to begin to turn off. However, even though the signal LS_IN is transitioning from logically low to logically high, the voltage difference between the supply voltage VDDM and the supply voltage VDD causes PMOS transistor PM1 to still be turned on resulting in contention between NMOS transistor NM1 and PMOS transistor PM1 thereby resulting in a delay DEL1 in the falling edge of signal OUTB. Stated differently, the transition of signal OUTB from logically high to logically low is delayed (e.g., delay DEL1) due to contention between NMOS transistor NM1 turning on and PMOS transistor PM1 still being turned on. However, as the signal FB transitions from logically low to logically high thereby causes PMOS transistor PM3 to turn off thereby allowing NMOS transistor NM1 to pull the signal OUTB to logically low (e.g., reference voltage VSS) thereby overcoming the contention with PMOS transistor PM1.

In some embodiments, at time T1, the signal FB transitions from logically low to logically high in response to the signal OUTB transitioning from logically high to logically low and the signal LS_INB transitioning from logically high to logically low. For example, in response to the signal OUTB transitioning from logically high to logically low, thereby causes PMOS transistor PM2 to begin to turn on thereby coupling the source of PMOS transistor PM4 to the second voltage supply VDDM. Furthermore, in response to the signal LS_INB transitioning from logically high to logically low thereby causes NMOS transistor NM2 to turn off, and PMOS transistor PM4 to begin to turn on. In response to PMOS transistor PM4 turning on and the source of PMOS transistor PM4 being coupled to the second voltage supply VDDM causes PMOS transistors PM4 and PM2 to pull signal FB logically high (e.g., toward supply voltage VDDM).

At time T2, the signal OUTB is logically low.

At time T2, the signal FB is logically high.

At time T2, the word line signal WL' transitions from logically low to logically high. In some embodiments, at time T2, the word line signal WL' transitions from logically low to logically high in response to at least the signal OUTB being logically low. For example, in response to the signal OUTB being logically low thereby causes NMOS transistor N4-3 to turn off, and PMOS transistor P4-3 to turn on thereby pulling the word line signal WL' logically high (e.g., toward supply voltage VDDM).

At time T3, the word line signal WL' is logically high.

At time T4, the signal LS_IN transitions from logically high to logically low. In some embodiments, in response to the signal LS_IN transitioning from logically high to logically low, thereby causes the signal LS_INB (not shown in FIG. 5) to transition from logically low to logically high.

At time T5, the signal OUTB transitions from logically high to logically low, and the signal FB transitions from logically low to logically high.

In some embodiments, at time T5, the signal OUTB transitions from logically low to logically high in response to at least the signal LS_IN transitioning from logically high to logically low or the signal FB transitioning from logically high to logically low. For example, in response to the signal LS_IN transitioning from logically high to logically low thereby causes NMOS transistor NM1 to turn off, and PMOS transistor PM1 to begin to turn on. Furthermore, as the signal FB transitions from logically high to logically low thereby causes PMOS transistor PM3 to turn on thereby allowing PMOS transistor PM1 to pull the signal OUTB to logically high (e.g., suppl voltage VDDM).

In some embodiments, memory circuit 400 is configured such that NMOS transistor NM2 is not in contention with at least one of PMOS transistor PM4 or PMOS transistor PM2 for the rising edge of signal OUTB or the falling edge of signal FB.

In some embodiments, memory circuit 400 is configured such that NMOS transistor NM1 is in contention with at least one of PMOS transistor PM1 or PMOS transistor PM3 for the falling edge of signal OUTB or the rising edge of signal FB.

In some embodiments, level shifter 406 or 606 is referred to as an "asymmetric level shifter" since the contention between the NMOS transistor NM1 and least one of PMOS transistor PM1 or PMOS transistor PM3 for the falling edge of signal OUTB or the rising edge of signal FB.

In some embodiments, at time T5, the signal FB transitions from logically high to logically low in response to the signal OUTB transitioning from logically low to logically high and the signal LS_INB transitioning from logically low to logically high. For example, in response to the signal OUTB transitioning from logically low to logically high, thereby causes PMOS transistor PM2 to begin to turn off thereby decoupling the source of PMOS transistor PM4 from the second voltage supply VDDM. Furthermore, in response to the signal LS_INB transitioning from logically low to logically high thereby causes NMOS transistor NM2 to turn on, and PMOS transistor PM4 to begin to turn off. In response to PMOS transistor PM4 turning off and NMOS transistor NM2 turning on causes NMOS transistor NM2 to pull signal FB logically low (e.g., toward reference voltage VSS).

At time T6, the signal OUTB is logically high.

At time T6, the signal FB is logically low.

At time T6, the word line signal WL' transitions from logically high to logically low. In some embodiments, at time T6, the word line signal WL' transitions from logically high to logically low in response to at least the signal OUTB being logically high. For example, in response to the signal OUTB being logically high thereby causes PMOS transistor P4-3 to turn off, and NMOS transistor N4-3 to turn on thereby pulling the word line signal WL' logically low (e.g., toward reference voltage VSS).

At time T7, the word line signal WL' is logically low.

After time T7, the next read operation or write operation of memory cell 202 of FIG. 2 or at least one memory cell in a single column of memory cell array 110AR of FIG. 1 occurs.

In some embodiments, after time T7, waveform 500 is repeated and is therefore similar to time TO, and similar detailed description is therefore omitted.

In some embodiments, timing diagram 500 causes at least memory circuit 400 to achieve one or more of the benefits described herein.

In some embodiments, while timing diagram 500 is described with respect to memory circuit 400, timing diagram 500 is also applicable to memory circuit 600 in a similar manner and is not described for brevity.

Other configurations of timing diagram 500 are within the scope of the present disclosure.

Figure 6:
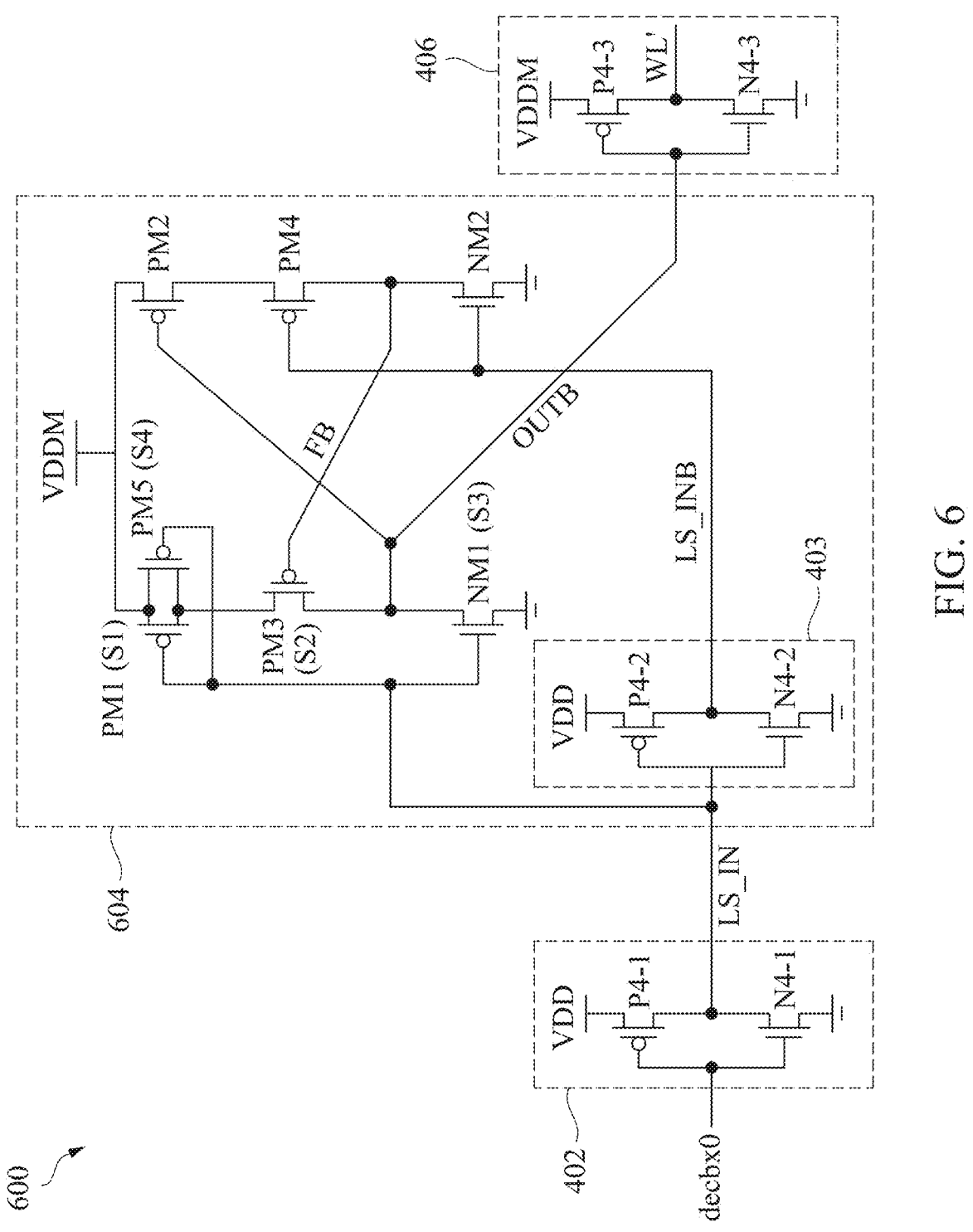
FIG. 6 is a circuit diagram of a memory circuit, in accordance with some embodiments.

FIG. 6 is a circuit diagram of a memory circuit 600, in accordance with some embodiments.

Memory circuit 600 is a variation of memory circuit 400 of FIG. 4, and similar detailed description is therefore omitted. For example, memory circuit 600 illustrates a non-limiting example where a level shifter 604 replaces the level shifter 404 of memory circuit 400 of FIG. 4, and similar detailed description is therefore omitted.

Memory circuit 600 includes inverter 402, inverter 403, a level shifter 604, and inverter 406. As shown in FIG. 6, inverter 403 is part of level shifter 604. In some embodiments, inverter 403 is not part of level shifter 604.

In comparison with memory circuit 400 of FIG. 4, level shifter 604 replaces the level shifter 404 of memory circuit 400 of FIG. 4, and similar detailed description is therefore omitted.

Level shifter 604 is a variation of level shifter 404 of FIG. 4, and similar detailed description is therefore omitted. In comparison with level shifter 404 of FIG. 4, level shifter 604 further includes a PMOS transistor PM5 in parallel with PMOS transistor PM1, and similar detailed description is therefore omitted.

Level shifter 604 includes PMOS transistor PM1, PMOS transistor PM2, PMOS transistor PM3, PMOS transistor PM4, NMOS transistor NM1, NMOS transistor NM2 and a PMOS transistor PM5.

A source of PMOS transistor PM5 is coupled to the source of PMOS transistor PM1 and the second voltage supply having the supply voltage VDDM. In some embodiments, each of the source of PMOS transistor PM5, the source of PMOS transistor PM1 and the source of PMOS transistor PM2 are coupled together.

In FIG. 6, each of a gate of PMOS transistor PM5, the gate of PMOS transistor PM1 and the gate of NMOS transistor NM1 are coupled together, and configured to receive signal LS_IN.

In FIG. 6, each of the gate of PMOS transistor PM5, the gate of PMOS transistor PM1, the gate of NMOS transistor NM1, the drain of PMOS transistor P4-1, the drain of NMOS transistor N4-1, the gate of PMOS transistor P4-2 and the gate of NMOS transistor N4-2 are coupled together.

In FIG. 6, each of a drain of PMOS transistor PM5, the drain of PMOS transistor PM1 and the source of PMOS transistor PM3 are coupled together.

In some embodiments, PMOS transistor PM5 has a size S4. In some embodiments, the size S4 is the same as at least one of size S1, S2, or S3. In some embodiments, the size S4 is different from at least one of size S1, S2, or S3. In some embodiments, the effect of the size S4 of PMOS transistor PM5 is similar to the size S1 of PMOS transistor PM1 described in FIG. 4, and similar detailed description is therefore omitted.

In some embodiments, by level shifter 604 including PMOS transistor PM5 in parallel with PMOS transistor PM1, the delay DEL1 of the rising edge of signal OUTB or signal FB is increased. In some embodiments, increasing the delay DEL1 of the rising edge of signal OUTB or signal FB causes the delay DEL2 (shown in FIG. 9) of the rising edge of the word line signal WL' to be increased.

In some embodiments, by level shifter 604 including PMOS transistor PM5 in parallel with PMOS transistor PM1, the delay DEL2 (shown in FIG. 9) of the rising edge of the word line signal WL' is increased.

In some embodiments, increasing a number of PMOS transistors in parallel with PMOS transistor PM1, further increases the delay DEL1 of the rising edge of signal OUTB or signal FB thereby further increasing the delay DEL2 (shown in FIG. 9) of the rising edge of the word line signal WL'.

While FIG. 6 is described with respect to the rising edge of the word line signal WL', the details of FIG. 6 are also applicable to a leading edge of the word line signal WL' which also includes a falling edge of the word line signal WL', and the details are omitted for brevity.

Other configurations, other types of circuit elements or other numbers of transistors in level shifter 604 are within the scope of the present disclosure.

In some embodiments, memory circuit 600 operates to achieve one or more of the benefits described herein.

Other configurations of memory circuit 600 are within the scope of the present disclosure. In some embodiments, operation of memory circuit 600 is the same as the operation of memory circuit 400, and therefore the timing diagram 500 of FIG. 5 is also applicable to memory circuit 600 and is not described for brevity.

Other configurations, other types of circuit elements or other numbers of transistors in memory circuit 600 are within the scope of the present disclosure.

FIG. 7 is a circuit diagram of a memory circuit 700, in accordance with some embodiments.

Memory circuit 700 is an embodiment of memory circuit 300, and similar detailed description is therefore omitted. Memory circuit 700 is an embodiment of a portion of at least one of memory partition 102A, 102B, 102C or 102D of FIG. 1, and similar detailed description is therefore omitted. For example, memory circuit 700 is an embodiment of one row of the WL driver circuit 110AC of FIG. 1, and similar detailed description is therefore omitted.

Memory circuit 700 is a variation of memory circuit 400 of FIG. 4, and similar detailed description is therefore omitted. For example, memory circuit 700 illustrates a non-limiting example where memory circuit 700 is a tracking word line driver circuit configured to generate a tracking word line signal TRKWL', and similar detailed description is therefore omitted.

Memory circuit 700 includes inverter 402, inverter 403, level shifter 404, and inverter 406.

In comparison with memory circuit 400 of FIG. 4, signal TRKLS_IN of FIG. 7 replaces signal LS_IN of memory circuit 400 of FIG. 4, signal TRKLS_INB of FIG. 7 replaces signal LS_INB of memory circuit 400 of FIG. 4, and tracking word line signal TRKWL' of FIG. 7 replaces word line signal WL' of memory circuit 400 of FIG. 4, and similar detailed description is therefore omitted.

In some embodiments, memory circuit 700 is a dual-rail circuit implementation using signals (e.g., tracking word line WL' and signal TRKLS_IN) of two different voltage domains.

Signal TRKLS_IN and signal TRKLS_INB are in the first voltage domain. Tracking word line signal TRKWL' are in the second voltage domain.

Memory circuit 700 is a tracking word line driver circuit configured to generate the tracking word line signal TRKWL' in response to the decoder signal DEC_X.

In some embodiments, memory circuit 700 operates to achieve one or more of the benefits described herein.

Other configurations, other types of circuit elements or other numbers of transistors in memory circuit 700 are within the scope of the present disclosure.

Figure 8:
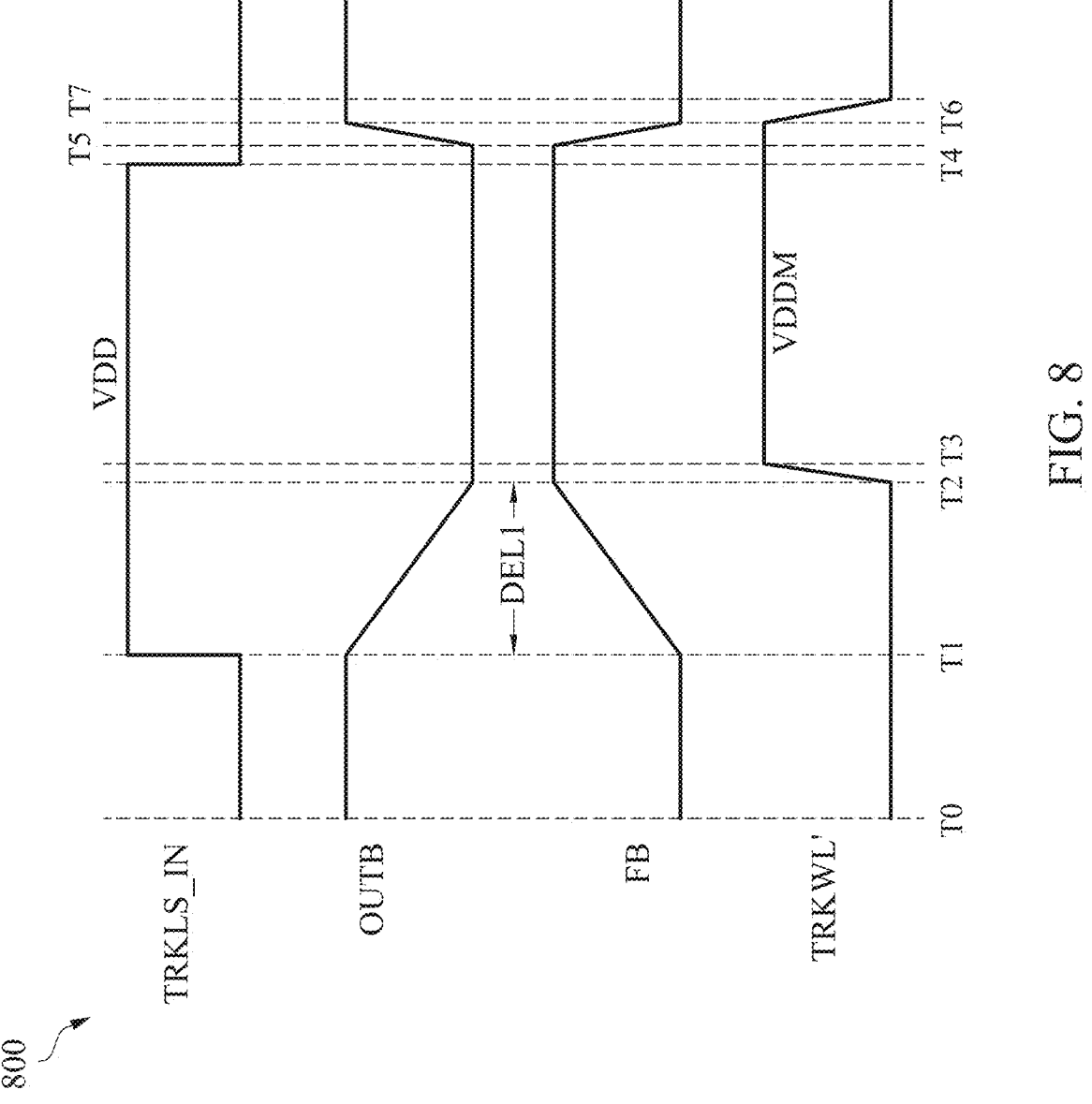
FIG. 8 is a timing diagram of waveforms of a memory circuit, such as the memory circuit in FIG. 7, in accordance with some embodiments.

FIG. 8 is a timing diagram 800 of waveforms of a memory circuit, such as memory circuit 700 in FIG. 7, in accordance with some embodiments.

In some embodiments, one or more read operations or write operations are applied to memory cell 202 of FIG. 2 or at least one memory cell in a single column of memory cell array 110AR of FIG. 1, and timing diagram 800 corresponds to waveforms during the one or more read operations or write operations of memory cell 202 of FIG. 2 or at least one memory cell in a single column of memory cell array 110AR of FIG. 1.

In some embodiments, one or more read operations or write operations of the memory banks in at least memory circuit 100 of FIG. 1 are applied to at least one of memory partition 102A, 102B, 102C or 102D, and timing diagram 800 corresponds to waveforms during the read operations or write operations of at least one of memory partition 102A, 102B, 102C or 102D.

Timing diagram 800 includes waveforms of the signal TRKLS_IN, the signal OUTB, the signal FB or the word line signal TRKWL.

Timing diagram 800 is a variation of timing diagram 500 of FIG. 5, and similar detailed description is therefore omitted. In comparison with timing diagram 500 of FIG. 5, signal TRKLS_IN of timing diagram 700 of FIG. 7 replaces signal LS_IN of timing diagram 500 of FIG. 5, and tracking word line signal TRKWL' of timing diagram 700 of FIG. 7 replaces word line signal WL' of timing diagram 500 of FIG. 5, and similar detailed description is therefore omitted.

In some embodiments, timing diagram 800 causes memory circuit 700 to achieve one or more of the benefits described herein.

Other configurations of timing diagram 800 are within the scope of the present disclosure.

Figure 9:
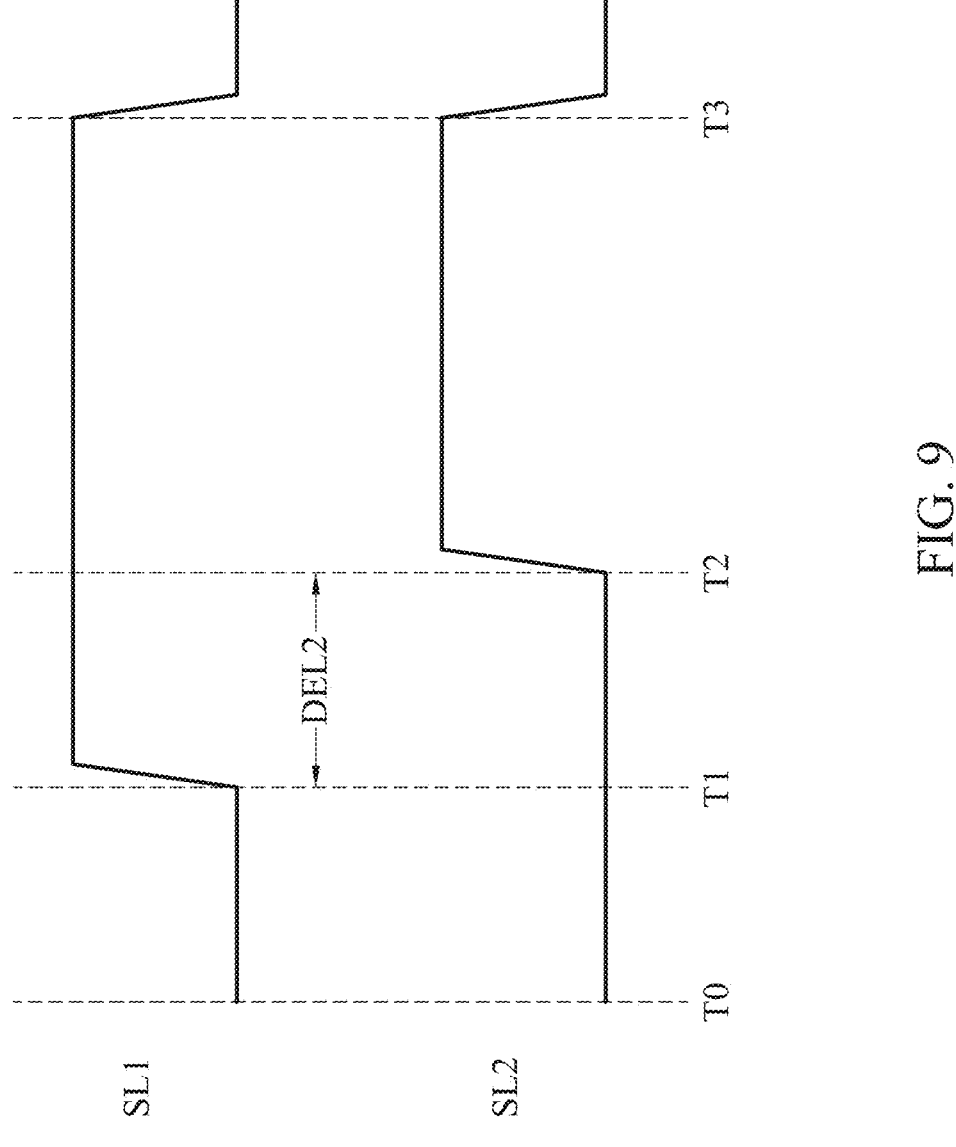
FIG. 9 is a timing diagram of waveforms of a memory circuit, such as the memory circuit in FIG. 4, FIG. 6 or FIG. 7, in accordance with some embodiments.

FIG. 9 is a timing diagram 900 of waveforms of a memory circuit, such as memory circuit 400 in FIG. 4, memory circuit 600 in FIG. 6 or memory circuit 700 in FIG. 7, in accordance with some embodiments.

In some embodiments, one or more read operations or write operations are applied to memory cell 202 of FIG. 2 or at least one memory cell in a single column of memory cell array 110AR of FIG. 1, and timing diagram 900 corresponds to waveforms during the one or more read operations or write operations of memory cell 202 of FIG. 2 or at least one memory cell in a single column of memory cell array 110AR of FIG. 1.

In some embodiments, one or more read operations or write operations of the memory banks in at least memory circuit 100 of FIG. 1 are applied to at least one of memory partition 102A, 102B, 102C or 102D, and timing diagram 900 corresponds to waveforms during the read operations or write operations of at least one of memory partition 102A, 102B, 102C or 102D.

Timing diagram 900 includes signal S1 and signal S2.

In some embodiments, signal S1 represents the word line signal WL' when the size S1 is equal to a first size Sla, and signal S2 represents the word line signal WL' when the size S1 is equal to a second size S2$a$, and the second size S2$a$ is greater than the first size Sla.

In some embodiments, signal S1 represents the tracking word line signal TRKWL' when the size S1 is equal to the first size Sla, and signal S2 represents the tracking word line signal TRKWL' when the size S1 is equal to the second size S2$a$, and the second size S2$a$ is greater than the first size Sla.

As shown in FIG. 9, signal SL2 is delayed with respect to signal SL1 by a delay DEL2. In some embodiments, an amount of delay DEL2 can be adjusted by level shifter 406 or 606.

In some embodiments, while timing diagram 900 is described with respect to size Sla and S2$a$, timing diagram 900 is also applicable to one or more of sizes S2, S3, or S4 in a similar manner and is not described for brevity.

In some embodiments, while timing diagram 900 is described with respect to size Sla and S2$a$, timing diagram 900 is also applicable to supply voltages of supply voltage VDDM that are different from each other in a similar manner and is not described for brevity.

In some embodiments, while timing diagram 900 is described with respect to FIG. 4, 6 or 7, timing diagram 900 is also applicable to one or more of memory banks 110L or 110R in a similar manner and is not described for brevity.

Other configurations of timing diagram 900 are within the scope of the present disclosure.

Figure 10:
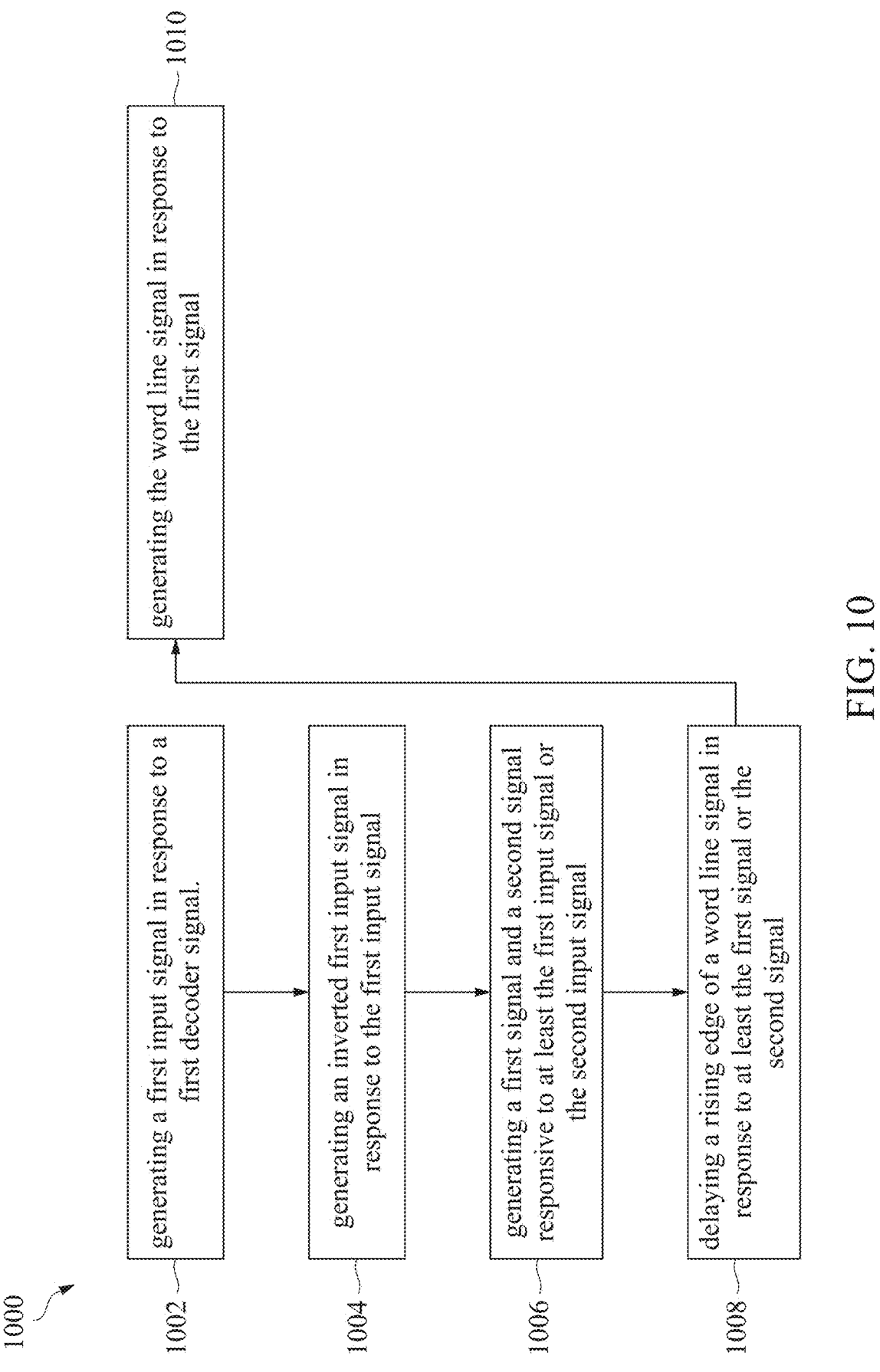
FIG. 10 is a flowchart of a method of operating a circuit, in accordance with some embodiments.

FIG. 10 is a flowchart of a method 1000 of operating a circuit, in accordance with some embodiments.

In some embodiments, FIG. 10 is a flowchart of a method 1000 of operating at least one of memory circuit 100 of FIG. 1, memory circuit 200 of FIG. 2, memory circuit 300 of FIG. 3, memory circuit 400 of FIG. 4, memory circuit 600 of FIG. 6 or memory circuit 700 of FIG. 7.

In some embodiments, FIG. 10 is a flowchart of a method 1000 of operating at least one of memory circuit 100 of FIG. 1, memory circuit 200 of FIG. 2, memory circuit 300 of FIG. 3, memory circuit 400 of FIG. 4, memory circuit 600 of FIG. 6 or memory circuit 700 of FIG. 7. In some embodiments, FIG. 10 is a flowchart of a method 1000 of operating a memory circuit, and the method 1000 includes the features of at least one of timing diagrams 500 of FIG. 5, timing diagram 800 of FIG. 8 or timing diagram 900 of FIG. 9, and similar detailed description is omitted for brevity.

It is understood that additional operations may be performed before, during, and/or after the method 1000 depicted in FIG. 10, and that some other operations may only be briefly described herein. It is understood that method 1000 utilizes features of one or more of least one of memory circuit 100 of FIG. 1, memory circuit 200 of FIG. 2, memory circuit 300 of FIG. 3, memory circuit 400 of FIG. 4, memory circuit 600 of FIG. 6 or memory circuit 700 of FIG. 7, and similar detailed description is omitted for brevity.

In some embodiments, other order of operations of method 1000 is within the scope of the present disclosure. Method 1000 includes exemplary operations, but the operations are not necessarily performed in the order shown. Operations may be added, replaced, changed order, and/or eliminated as appropriate, in accordance with the spirit and scope of disclosed embodiments. In some embodiments, one or more of the operations of method 1000 is not performed.

In operation 1002 of method 1000, a first input signal is generated in response to a first decoder signal.

In some embodiments, operation 1002 is performed by a first post-decoder circuit. In some embodiments, the first post-decoder circuit of method 1000 includes post-decoder circuit 302.

In some embodiments, the first input signal of method 1000 includes at least one of input signal LS_IN or TRKLS_IN.

In some embodiments, the first decoder signal of method 1000 includes decoder signal DEC_X.

In operation 1004 of method 1000, an inverted first input signal is generated in response to a first input signal. In some embodiments, the first input signal is inverted from the inverted first input signal.

In some embodiments, operation 1004 is performed by an inverter. In some embodiments, the inverter of method 1000 includes inverter 403.

In some embodiments, the inverted first input signal of method 1000 includes at least one of input signal LS_INB or TRKLS_INB.

In operation 1006 of method 1000, a first signal and a second signal are generated responsive to at least the first input signal or the second input signal.

In some embodiments, operation 1006 and 1008 are performed by a level shifter. In some embodiments, the level shifter of method 1000 includes at least one of level shifter 404 or 604.

In some embodiments, the first signal of method 1000 includes at least signal OUTB. In some embodiments, the second signal of method 1000 includes at least signal FB.

In operation 1008 of method 1000, a leading edge of a word line signal is delayed in response to at least the first signal or the second signal. In some embodiments, the leading edge of the word line signal includes a rising edge or a falling edge.

In some embodiments, the word line signal of method 1000 includes at least word line signal WL'.

In some embodiments, an amount of delay of the leading edge of the word line signal is based on a voltage difference between a first supply voltage and a second supply voltage. In some embodiments, the first supply voltage has a first swing. In some embodiments, the second supply voltage has a second swing.

In some embodiments, an amount of delay of the leading edge of the word line signal includes delay DEL2. In some embodiments, the first supply voltage includes supply voltage VDD. In some embodiments, the second supply voltage includes supply voltage VDDM.

In operation 1010 of method 1000, the word line signal is generated in response to the first signal. In some embodiments, the word line signal is inverted from the first signal.

In some embodiments, operation 1010 is performed by an inverter. In some embodiments, the inverter of method 1000 includes inverter 406.

By operating method 1000, at least one of memory circuit 100 of FIG. 1, memory circuit 200 of FIG. 2, memory circuit 300 of FIG. 3, memory circuit 400 of FIG. 4, memory circuit 600 of FIG. 6 or memory circuit 700 of FIG. 7 operate to achieve the benefits discussed herein.

In some embodiments, one or more of the operations of method 1000 is not performed. Furthermore, various PMOS or NMOS transistors shown in FIGS. 2, 4 and 6-7 are of a particular dopant type (e.g., N-type or P-type) are for illustration purposes. Embodiments of the disclosure are not limited to a particular transistor type, and one or more of the PMOS or NMOS transistors shown in FIGS. 2, 4 and 6-7 can be substituted with a corresponding transistor of a different transistor/dopant type. Similarly, the low or high logical value of various signals used in the above description is also for illustration. Embodiments of the disclosure are not limited to a particular logical value when a signal is activated and/or deactivated. Selecting different logical values is within the scope of various embodiments. Selecting different numbers of inverters in FIGS. 2, 4 and 6-7 is within the scope of various embodiments. Selecting different numbers of transistors in FIGS. 2, 4 and 6-7 is within the scope of various embodiments.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

One aspect of this description relates to a memory circuit. In some embodiments, the memory circuit includes a first inverter coupled to a first voltage supply, and configured to generate a first input signal in response to a second input signal, the first input signal being inverted from the second input signal. In some embodiments, the memory circuit further includes a level shifter circuit coupled to at least the first inverter and a second voltage supply different from the first voltage supply, and configured to receive at least the first input signal or the second input signal, and to generate a first signal and a second signal responsive to at least the first input signal or the second input signal. In some embodiments, the memory circuit further includes a second inverter configured to generate a word line signal in response to the first signal. In some embodiments, the level shifter circuit is configured to delay a leading edge of the word line signal in response to at least the first signal or the second signal, an amount of delay of the leading edge of the word line signal is based on a voltage difference between the first supply voltage and the second supply voltage, the first supply voltage having a first swing, and the second supply voltage having a second swing.

Another aspect of this description relates to a memory circuit. The memory circuit includes a memory cell array, and a word line driver coupled to the memory cell array. In some embodiments, the word line driver includes a first inverter coupled to a first voltage supply, and configured to generate a first input signal in response to a second input signal, the first input signal being inverted from the second input signal. In some embodiments, the word line driver further includes a level shifter circuit coupled to at least the first inverter and a second voltage supply different from the first voltage supply, and configured to receive at least the first input signal or the second input signal, and to generate a first signal and a second signal responsive to at least the first input signal or the second input signal. In some embodiments, the word line driver further includes a second inverter configured to generate a word line signal in response to the first signal. In some embodiments, the level shifter circuit is configured to delay a leading edge of the word line signal in response to at least the first signal or the second signal, an amount of the delay of the leading edge of the word line signal is based on a voltage difference between the first supply voltage and the second supply voltage, the first supply voltage having a first swing, and the second supply voltage having a second swing.

Still another aspect of this description relates to a method of operating a memory circuit. In some embodiments, the method includes generating, by a first inverter, an inverted first input signal in response to a first input signal, the first input signal being inverted from the inverted first input signal. In some embodiments, the method further includes generating, by a level shifter circuit, a first signal and a second signal responsive to at least the first input signal or the second input signal. In some embodiments, the method further includes delaying, by the level shifter circuit, a leading edge of a word line signal in response to at least the first signal or the second signal, an amount of delay of the leading edge of the word line signal is based on a voltage difference between a first supply voltage and a second supply voltage, the first supply voltage having a first swing, and the second supply voltage having a second swing. In some embodiments, the method further includes generating, by a second inverter, the word line signal in response to the first signal, the word line signal being inverted from the first signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit comprising:
a first inverter coupled to a first voltage supply, and configured to generate a first input signal in response to a second input signal, the first input signal being inverted from the second input signal;
a level shifter circuit coupled to at least the first inverter or a second voltage supply different from the first voltage supply, and configured to receive at least the first input signal or the second input signal, and to generate a first signal and a second signal responsive to at least the first input signal or the second input signal; and
a second inverter configured to generate a word line signal in response to the first signal,
wherein the level shifter circuit is configured to delay a leading edge of the word line signal in response to at least the first signal or the second signal, an amount of delay of the leading edge of the word line signal is based on a voltage difference between the first supply voltage and the second supply voltage, the first supply voltage having a first swing, and the second supply voltage having a second swing, and the level shifter circuit comprises:
a first p-type transistor including a first terminal configured to receive the second input signal, a second terminal of the first p-type transistor is coupled to the second voltage supply, and a third terminal of the first p-type transistor is coupled to at least a first node;
a second p-type transistor including a first terminal coupled to at least a second node, and configured to receive the second signal, a second terminal of the second p-type transistor is coupled to the third terminal of the first p-type transistor and the first node, and a third terminal of the second p-type transistor is coupled to at least a third node; and
a first n-type transistor including a first terminal coupled to the first terminal of the first P-type transistor, and configured to receive the second input signal, a second terminal of the first n-type transistor is coupled to a reference voltage supply, and a third terminal of the first n-type transistor is coupled to the third node and the third terminal of the second p-type transistor.

2. The memory circuit of claim 1, further comprising:
a post-decoder circuit coupled to the first voltage supply and the first inverter, and configured to generate the second input signal in response to a first decoder signal.

3. The memory circuit of claim 2, wherein the post-decoder circuit comprises:
a third p-type transistor including a first terminal of the third p-type transistor configured to receive the first decoder signal, a second terminal of the third p-type transistor is coupled to the first voltage supply, and a third terminal of the third p-type transistor is coupled to a first output node; and
a second n-type transistor including a first terminal of the second n-type transistor configured to receive the first decoder signal, a second terminal of the second n-type transistor is coupled to the reference voltage supply, and a third terminal of the second n-type transistor is coupled to the first output node and the third terminal of the third p-type transistor.

4. The memory circuit of claim 1, wherein the level shifter circuit further comprises:
a third p-type transistor including a first terminal coupled to the third node, the third terminal of the first n-type transistor and the third terminal of the second p-type transistor, and configured to receive the first signal, a second terminal of the third p-type transistor is coupled to the second voltage supply, and a third terminal of the third p-type transistor is coupled to at least a fourth node;
a fourth p-type transistor including a first terminal coupled to an output terminal of the first inverter, and configured to receive the first input signal, a second terminal of the fourth p-type transistor is coupled to the fourth node and the third terminal of the third p-type transistor, and a third terminal of the fourth p-type transistor is coupled to the second node and the first terminal of the first p-type transistor; and
a second n-type transistor including a first terminal coupled to the output terminal of the first inverter, and the first terminal of the fourth p-type transistor, and configured to receive the first input signal, a second terminal of the second n-type transistor is coupled to the reference voltage supply, and a third terminal of the second n-type transistor is coupled to the third terminal of the fourth p-type transistor, the second node and the first terminal of the first p-type transistor.

5. The memory circuit of claim 4, wherein the level shifter circuit further comprises:

a fifth p-type transistor including a first terminal coupled to the first terminal of the first P-type transistor and the first terminal of the first N-type transistor, and configured to receive the second input signal, a second terminal of the fifth p-type transistor is coupled to the second voltage supply and the second terminal of the first p-type transistor, and a third terminal of the fifth p-type transistor is coupled to the first node, the third terminal of the first p-type transistor and the second terminal of the second p-type transistor.

6. The memory circuit of claim 1, wherein
the first p-type transistor further including a first size,
the second p-type transistor further including a second size,
the first n-type transistor further including a third size, and
the first size is greater than the third size.

7. The memory circuit of claim 6, wherein the second size is greater than the third size.

8. The memory circuit of claim 7, wherein the first size is equal to the second size.

9. The memory circuit of claim 7, wherein the first size is different from the second size.

10. The memory circuit of claim 1, wherein the first inverter comprises:

a third type transistor including a first terminal of the third p-type transistor configured to receive the first input signal, a second terminal of the third p-type transistor is coupled to the first voltage supply, and a third terminal of the third p-type transistor is coupled to a first output node; and a second n-type transistor including a first terminal of the second n-type transistor configured to receive the first input signal, a second terminal of the second n-type transistor is coupled to the reference voltage supply, and a third terminal of the second n-type transistor is coupled to the first output node and the third terminal of the third p-type transistor.

11. The memory circuit of claim 1, wherein the second inverter comprises:

a third p-type transistor including a first terminal of the third p-type transistor configured to receive the first signal, a second terminal of the third p-type transistor is coupled to the second voltage supply, and a third terminal of the third p-type transistor is coupled to a first output node; and a second n-type transistor including a first terminal of the second n-type transistor configured to receive the first signal, a second terminal of the second n-type transistor is coupled to the reference voltage supply, and a third terminal of the second n-type transistor is coupled to the first output node and the third terminal of the third p-type transistor.

12. A memory circuit comprising:
a memory cell array; and
a word line driver coupled to the memory cell array, the word line driver comprising:
a first inverter coupled to a first voltage supply, and configured to generate a first input signal in response to a second input signal, the first input signal being inverted from the second input signal;

a level shifter circuit coupled to at least the first inverter or a second voltage supply different from the first voltage supply, and configured to receive at least the first input signal or the second input signal, and to generate a first signal and a second signal responsive to at least the first input signal or the second input signal; and a second inverter configured to generate a word line signal in response to the first signal, wherein the level shifter circuit is configured to delay a leading edge of the word line signal in response to at least the first signal or the second signal, an amount of the delay of the leading edge of the word line signal is based on a voltage difference between the first supply voltage and the second supply voltage, the first supply voltage having a first swing, and the second supply voltage having a second swing, wherein the level shifter circuit comprises:

a first p-type transistor including a first terminal configured to receive the second input signal, a second terminal of the first p-type transistor is coupled to the second voltage supply, and a third terminal of the first p-type transistor is coupled to at least a first node;

a second p-type transistor including a first terminal coupled to at least a second node, and configured to receive the second signal, a second terminal of the second p-type transistor is coupled to the third terminal of the first p-type transistor and the first node, and a third terminal of the second p-type transistor is coupled to at least a third node; and a first n-type transistor including a first terminal coupled to the first terminal of the first P-type transistor, and configured to receive the second input signal, a second terminal of the first n-type transistor is coupled to a reference voltage supply, and a third terminal of the first n-type transistor is coupled to the third node and the third terminal of the second p-type transistor.

13. The memory circuit of claim 10, wherein the level shifter circuit further comprises:

a third p-type transistor including a first terminal coupled to the third node, the third terminal of the first n-type transistor and the third terminal of the second p-type transistor, and configured to receive the first signal, a second terminal of the third p-type transistor is coupled to the second voltage supply, and a third terminal of the third p-type transistor is coupled to at least a fourth node;

a fourth p-type transistor including a first terminal coupled to an output terminal of the first inverter, and configured to receive the first input signal, a second terminal of the fourth p-type transistor is coupled to the fourth node and the third terminal of the third p-type transistor, and a third terminal of the fourth p-type transistor is coupled to the second node and the first terminal of the first p-type transistor; and a second n-type transistor including a first terminal coupled to the output terminal of the first inverter, and the first terminal of the fourth p-type transistor, and configured to receive the first input signal, a second terminal of the second n-type transistor is coupled to the reference voltage supply, and a third terminal of the second n-type transistor is coupled to the third terminal of the fourth p-type transistor, the second node and the first terminal of the first p-type transistor.

14. The memory circuit of claim 13, wherein the level shifter circuit further comprises:

a fifth p-type transistor including a first terminal coupled to the first terminal of the first P-type transistor and the first terminal of the first N-type transistor, and configured to receive the second input signal, a second terminal of the fifth p-type transistor is coupled to the second voltage supply and the second terminal of the first p-type transistor, and a third terminal of the fifth p-type transistor is coupled to the first node, the third terminal of the first p-type transistor and the second terminal of the second p-type transistor.

15. The memory circuit of claim 12, wherein the word line driver further comprises:

a post-decoder circuit coupled to the first voltage supply and the first inverter, and configured to generate the second input signal in response to a first decoder signal.

16. The memory circuit of claim 15, wherein the post-decoder circuit comprises:

a third p-type transistor including a first terminal of the third p-type transistor configured to receive the first decoder signal, a second terminal of the third p-type transistor is coupled to the first voltage supply, and a third terminal of the third p-type transistor is coupled to a first output node; and a second n-type transistor including a first terminal of the second n-type transistor configured to receive the first decoder signal, a second terminal of the second n-type transistor is coupled to the reference voltage supply, and a third terminal of the second n-type transistor is coupled to the first output node and the third terminal of the third p-type transistor.

17. The memory circuit of claim 12, wherein the first p-type transistor further including a first size, the second p-type transistor further including a second size, the first n-type transistor further including a third size, and the first size is greater than the third size.

18. The memory circuit of claim 17, wherein the second size is greater than the third size.

19. A method of operating a memory circuit, the method comprising:

generating, by a first inverter, an inverted first input signal in response to a first input signal, the first input signal being inverted from the inverted first input signal;

generating, by a level shifter circuit, a first signal and a second signal responsive to at least the first input signal or a second input signal;

delaying, by the level shifter circuit, a leading edge of a word line signal in response to at least the first signal or the second signal, an amount of delay of the leading edge of the word line signal is based on a voltage difference between a first supply voltage and a second supply voltage, the first supply voltage having a first swing, and the second supply voltage having a second swing; and generating, by a second inverter, the word line signal in response to the first signal, the word line signal being inverted from the first signal, wherein the level shifter circuit comprises:

a first p-type transistor including a first terminal configured to receive the second input signal, a second terminal of the first p-type transistor is coupled to a first voltage supply, and a third terminal of the first p-type transistor is coupled to at least a first node;

a second p-type transistor including a first terminal coupled to at least a second node, and configured to receive the second signal, a second terminal of the second p-type transistor is coupled to the third terminal of the first p-type transistor and the first node, and a third terminal of the second p-type transistor is coupled to at least a third node; and a first n-type transistor including a first terminal coupled to the first terminal of the first P-type transistor, and configured to receive the second input signal, a second terminal of the first n-type transistor is coupled to a reference voltage supply, and a third terminal of the first n-type transistor is coupled to the third node and the third terminal of the second p-type transistor.

20. The method of claim 19, further comprising:

generating, by a first post-decoder circuit, the first input signal in response to a first decoder signal.

* * * * *